United States Patent [19]
Furukawa

[11] Patent Number: 6,088,378
[45] Date of Patent: Jul. 11, 2000

[54] RING CAVITY TYPE SURFACE EMITTING SEMICONDUCTOR LASER AND FABRICATION METHOD THEREOF

[75] Inventor: Yukio Furukawa, Sagamihara, Japan

[73] Assignee: Canon Kabushiki Kaisha, Tokyo, Japan

[21] Appl. No.: 09/067,003

[22] Filed: Apr. 27, 1998

[30] Foreign Application Priority Data

Apr. 25, 1997 [JP] Japan .................................... 9-122929

[51] Int. Cl.[7] ....................................................... H01S 3/08
[52] U.S. Cl. .................................. 372/92; 372/94; 372/43
[58] Field of Search .................. 372/92, 94, 96, 372/43

Primary Examiner—Frank G. Font
Assistant Examiner—Gioacchino Inzirillo
Attorney, Agent, or Firm—Fitzpatrick, Cella, Harper & Scinto

[57] ABSTRACT

A surface emitting semiconductor laser of a ring cavity type with a small cavity loss includes a ring cavity or resonator which is constructed wituout using at least one of a pair of special high-reflection multi-layer mirrors and formed in a plane approximately perpendicular to its substrate. The ring cavity is built by a parallel face parallel to the substrate and at least one total reflection face formed opposed to the parallel face. The total reflection face may be a mesa-shaped semiconductor face, a polygonal cone-shaped semiconductor face, a quadrangular cone-shaped semiconductor, a circular cone-shaped semiconductor face or the like.

32 Claims, 22 Drawing Sheets

FIG.1
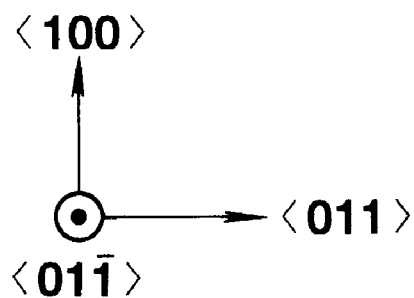
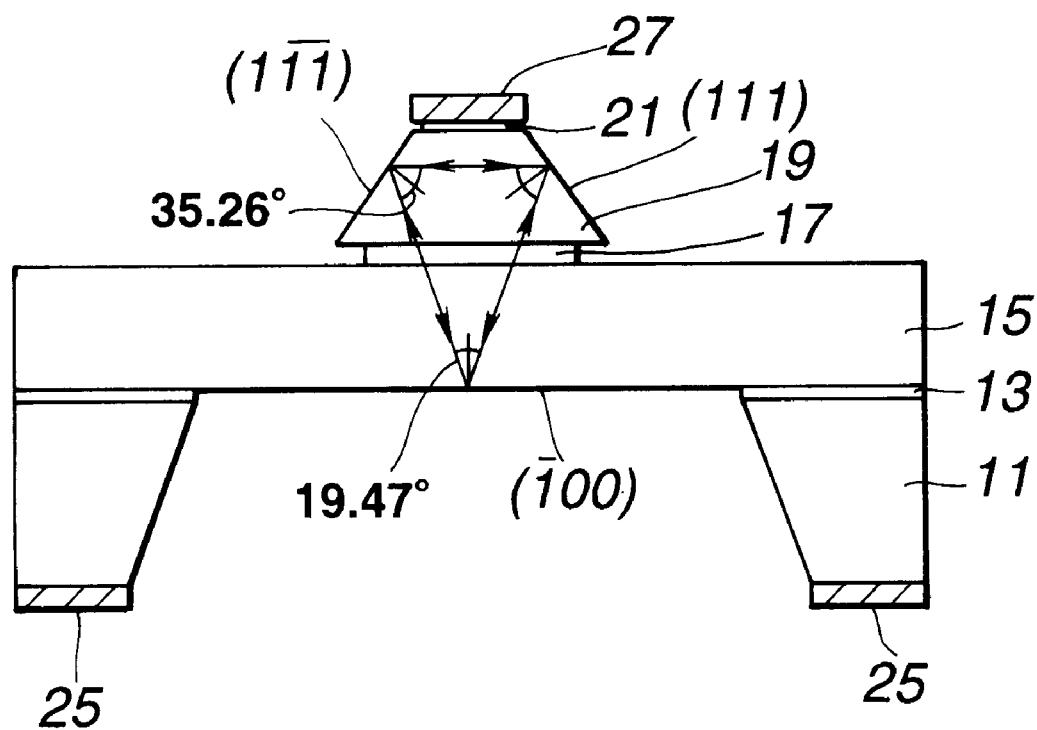

FIG.7
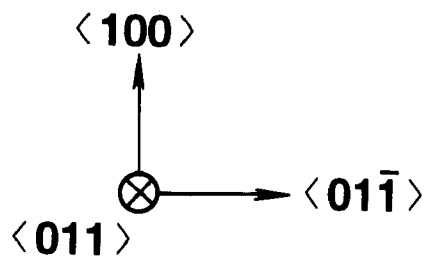
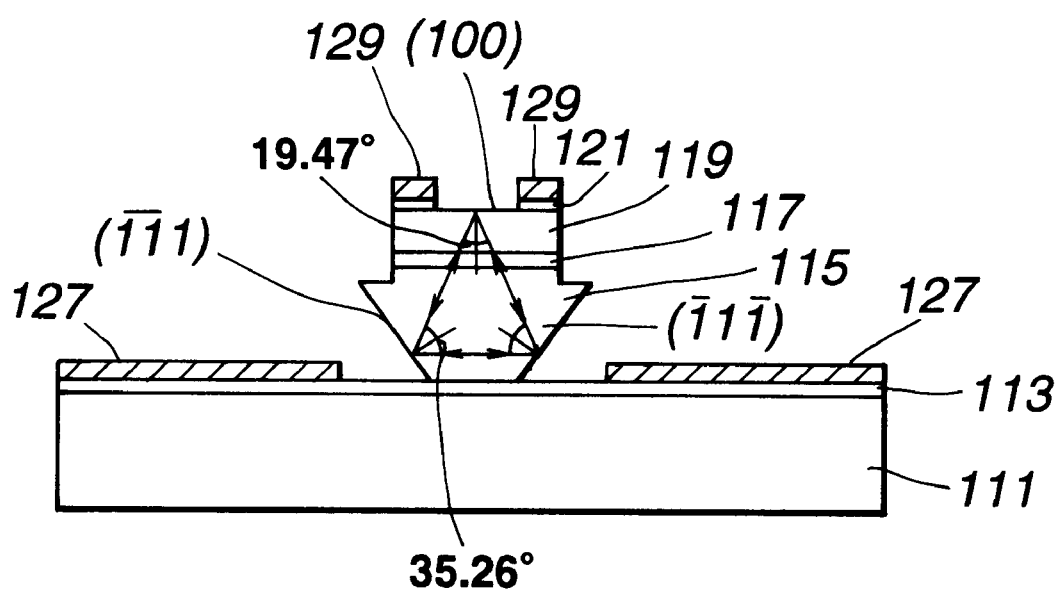

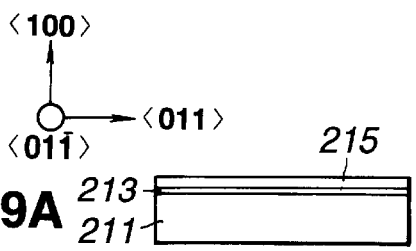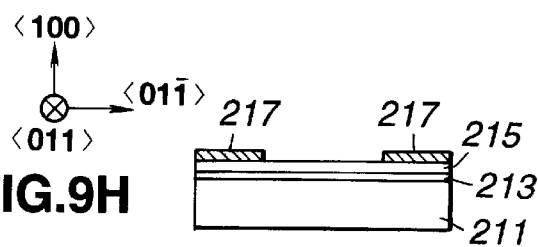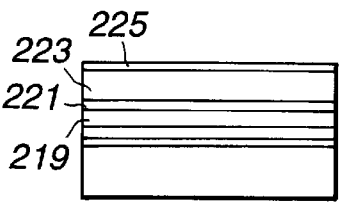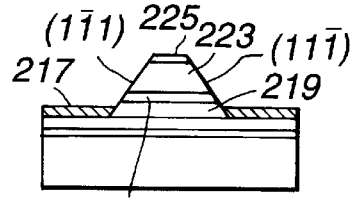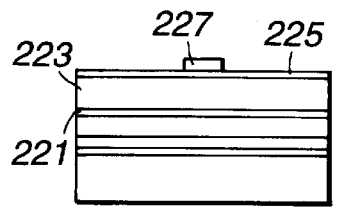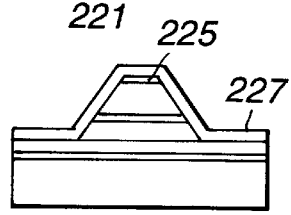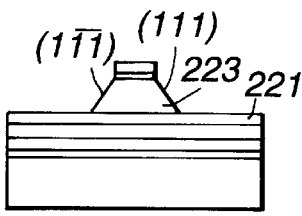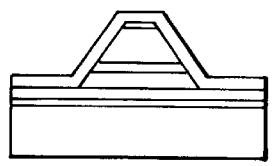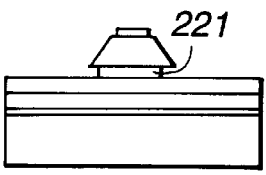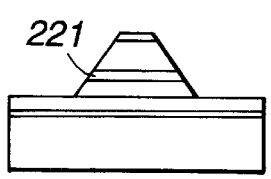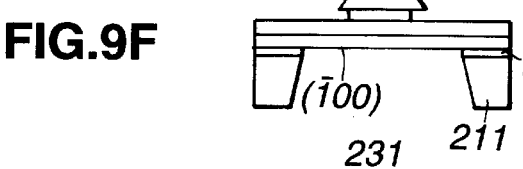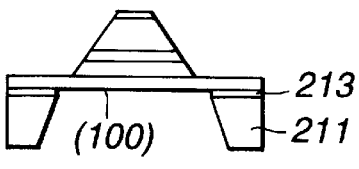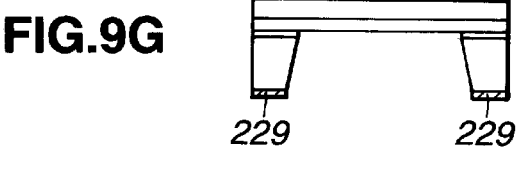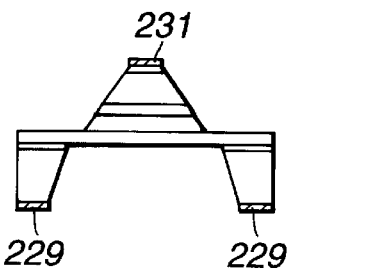

FIG.11
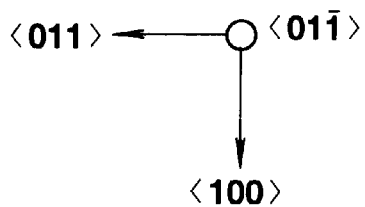
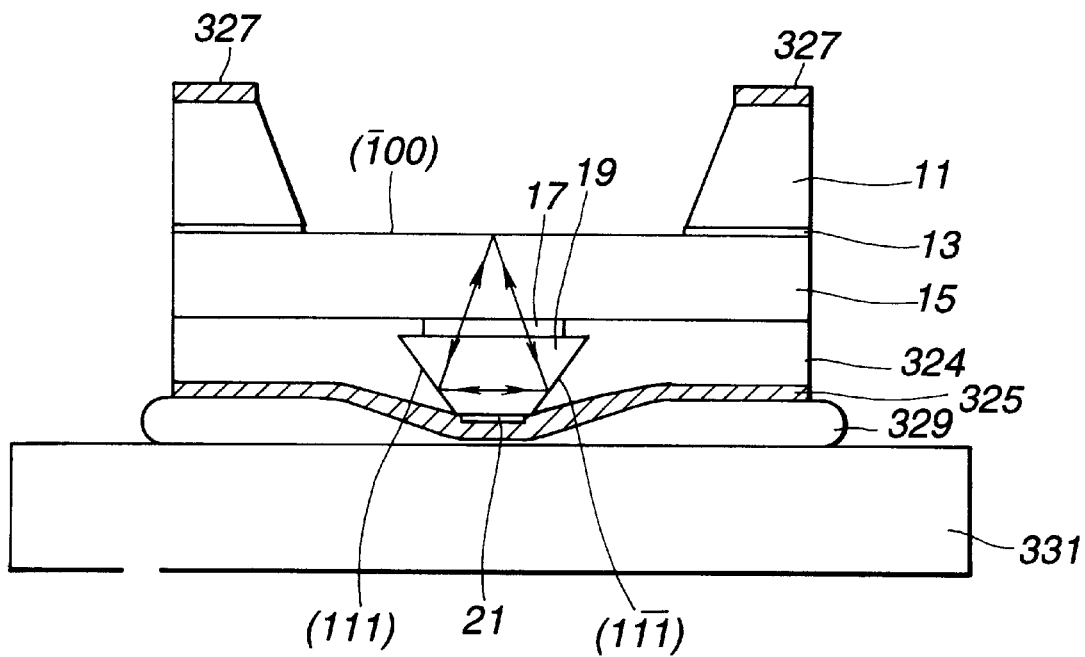

RING CAVITY TYPE SURFACE EMITTING SEMICONDUCTOR LASER AND FABRICATION METHOD THEREOF

BACKGROUND OF THE INVENTION

1. Field of the Invention

The present invention relates to a low-threshold semiconductor laser of a minute cavity (or resonator) type which is usable for optical interconnections, parallel data processing, large-capacity parallel optical transmission and so forth, and particularly to a surface emitting semiconductor laser of a ring cavity type wherein resonance is generated in its layering direction, a fabrication method thereof, etc.

2. Related Background Art

With surface emitting semiconductor lasers, a two-dimensional arraying is possible with high density, and a low-threshold driving is possible as well. Because of those features, the surface emitting semiconductor laser is well-suited and popular as a light source in technical fields, such as optical interconnections, parallel optical data processing and large-capacity parallel optical transmission, and its development has been advanced noticeably.

The surface emitting semiconductor laser is generally comprised of a Fabry-Perot cavity with a cavity length of several microns which is formed of a pair of reflection mirrors. The surface emitting laser is roughly classified into two types depending on the kind of its substrate: one is a GaAs-series surface emitting laser with an oscillation wavelength of 0.85 $\mu$m or 0.98 $\mu$m, and the other is an InP-series surface emitting laser with an oscillation wavelength of 1.3 $\mu$m or 1.55 $\mu$m. Further, in order to promote a low threshold, it is required that the reflection mirror is as transparent as possible to the oscillation wavelength and has as high a reflectivity as possible. For those purposes, a multi-layer mirror is ordinarily used, which is formed by alternately depositing two kinds of materials having different indices of refraction with a thickness of a quarter of the oscillation wavelength.

In the case of a GaAs series surface, an AlAs/(Al)GaAs multi-layer, which can be epitaxially grown on the GaAs substrate, is generally used as a mirror. On the other hand, in the case of an InP series surface, since the refractive-index difference between InGaAsP/InP, which can be epitaxially grown on the InP substrate, is small and a high reflectivity is hard to obtain thereby, other materials, such as a $SiO_2$/Si multi-layer and an $Al_2O_3$/Si multi-layer, are generally used. Furthermore, the following method is also known. An AlAs/(Al)GaAs multi-layer, which is grown on the GaAs substrate, is fused with semiconductor layers including an active layer, which are separately grown on the InP substrate.

In the case of the GaAs series surfaces of the prior art surface emitting semiconductor lasers, however, layering of more than twenty pairs of AlAs and (Al)GaAs layers is needed to obtain a high reflectivity when using the AlAs/(Al)GaAs multi-layer, and therefore, much time is required to grow that multi-layer.

On the other hand, in the case of InP series surfaces, the $SiO_2$/Si multi-layer or the $Al_2O_3$/Si multi-layer has to be grown by a method in which deposition and sputtering are performed to form this multi-layer after semicondctor layers are processed using the etching and the like. Thus, its fabrication process is complicated. Further, the thermal conductivity of $SiO_2$ is small, and the thermal conductivity of the Si film, which is formed by deposition and sputtering, is also small, compared to that of a single crystal of Si. Hence, the thermal characteristics or thermal radiation efficiency of a laser with those materials are not what could be desired.

Further, where the AlAs/(Al)GaAs multi-layer is fused with the semiconductor layers, its thermal conductivity is relatively large, compared to those of the $SiO_2$/Si multi-layer and the $Al_2O_3$/Si multi-layer. However, since the fusion method is used, the process is complicated. Moreover, since the interface formed by the fusion is in the cavity, the condition of the interface (such as its cleanness and the junction strength) are likely to directly influence the laser characteristics.

Further, in the multi-layer on the p-side, it is difficult to lower its resistance even if doping of the layer is performed, because a number of hetero-barriers exist therein. Therefore, the electrode must be formed in such manner that an injected current can shun the multi-layer.

SUMMARY OF THE INVENTION

A first object of the present invention is to provide a low-threshold surface emitting semiconductor laser of a ring cavity type with a small cavity loss which can be constructed without using at least one of a pair of high-reflection multi-layer mirrors, its fabrication method and so forth.

A second object of the present invention is to provide a low-threshold surface emitting semiconductor laser of a ring cavity type with a small cavity loss which can be constructed without using any high-reflection multi-layer mirrors, its fabrication method and so forth.

A third object of the present invention is to provide a low-threshold surface emitting semiconductor laser of a ring cavity type with a small cavity loss which can be constructed using a single high-reflection multi-layer mirror on one side of its active region, its fabrication method and so forth.

A fourth object of the present invention is to provide a surface emitting semiconductor laser of a ring cavity type with a small cavity loss whose fabrication freedom is large, whose thermal radiation characteristic is improved and which can be constructed without using at least one of a pair of high-reflection multi-layer mirrors, its fabrication method and so forth.

The present invention is generally directed to a surface emitting semiconductor laser of a ring cavity type with a small cavity loss in which a ring cavity or resonator is formed in a plane approximately perpendicular to its substrate.

Specifically, a surface emitting semiconductor laser for achieving the first object has a ring cavity formed in a plane approximately perpendicular to its substrate; that the ring cavity is built by a parallel face parallel to the substrate and at least one total reflection face formed opposed to the parallel face. The total reflection face may be a mesa-shaped semiconductor face, a polygonal cone-shaped semiconductor face, a quadrangular cone-shaped semiconductor, a circular cone-shaped semiconductor face or the like.

A surface emitting semiconductor laser for achieving the second object has the parallel face, likewise, a total reflection face in the structure of the surface emitting semiconductor laser for achieving the first object.

A surface emitting semiconductor laser for achieving the third object has a multi-layer reflection mirror formed on the parallel face in the structure of a surface emitting semiconductor laser as described above for achieving the first object.

A surface emitting semiconductor laser for achieving the fourth object has the total reflection face covered with a burying material in the structure of a surface emitting semiconductor laser as described above for achieving the first object.

More specifically, the surface emitting semiconductor laser of the present invention includes semiconductor layers with an active layer grown on a semiconductor substrate of a zinc blende type crystalline structure and is formed of a ring cavity structure which has reflection faces of (100), ($\bar{1}11$) and ($\bar{1}1\bar{1}$) faces or (100), ($\bar{1}11$) and ($\bar{1}1\bar{1}$) faces, or three crystalline faces which are in an equivalent positional relationship with those crystalline faces when considering the crystal symmetry (for example, three faces of (100), ($\bar{1}11$) and ($\bar{1}1\bar{1}$) faces are in an equivalent positional relationship with three faces ($\bar{1}00$), ($1\bar{1}1$) and ($11\bar{1}$) faces shown in FIG. 9.

The three reflection faces are a (100) face and ($\bar{1}11$) and ($\bar{1}1\bar{1}$) faces which are formed on opposite slant faces of a semiconductor face with a (100) face when a reverse mesa shape is formed on the semiconductor face by performing a face-orientation dependent etching through a stripe-shaped mask formed on the semiconductor face and extending in a <011> direction, or three crystalline faces which are in an equivalent positional relationship with those crystalline faces considering the crystal symmetry.

The three reflection faces are a ($\bar{1}00$) face and ($1\bar{1}\bar{1}$) and (111) faces which are generated on opposite slant faces of a semiconductor face with a (100) face when a forward mesa shape is formed on the semiconductor face by performing a face-orientation dependent etching through a stripe-shaped mask formed on the semiconductor face and extending in a <$01\bar{1}$> direction, or three crystalline faces which are in an equivalent positional relationship with those crystalline faces when considering the crystal symmetry.

The three reflection faces are a ($\bar{1}00$) face and ($1\bar{1}1$) and ($11\bar{1}$) faces which are formed on opposite slant faces of a semiconductor face with a (100) face when a forward mesa shape is formed on the semiconductor face by performing a selective growth on a mask with a stripe-shaped opening formed on the semiconductor face and extending in a <011> direction, or three crystalline faces which are in an equivalent positional relationship with those crystalline faces when considering the crystal symmetry.

The surface emitting semiconductor laser of the present invention includes semiconductor layers with an active layer grown on a semiconductor substrate of a zinc blende type crystalline structure with a (100) face and its quadrangular cone-shaped total reflection semiconductor faces are comprised of ($1\bar{1}\bar{1}$), (111) and ($11\bar{1}$) and ($1\bar{1}1$) faces.

At least one total reflection face formed opposite to the face parallel to the substrate is formed by an etching during which the semiconductor is irradiated by ion beams using an appropriately-shaped mask formed on the semiconductor. A semiconductor face with a predetermined angle can be readily formed.

At least one total reflection face formed opposite to the face parallel to the substrate can be formed by an etching during which the semiconductor is irradiated by ion beams projected in a direction forming a predetermined angle relative to a normal to the semiconductor, while the substrate being rotated about the normal, using an appropriately-shaped mask formed on the semiconductor.

The total reflection face can be surrounded, except part thereof, by an insulating burying material whose index of refraction is smaller than that of the semiconductor of the total reflection face such that the total reflection condition can be satisfied. Specifically, the total reflection face is surrounded by the burying material except its central portion, and an electrode is in an electrical contact with the semiconductor layer at the central portion of the total reflection face. The electrode may be formed on the entire face of the central portion of the total reflection face and the burying material. The burying material may be glued to a heat sink using an adhesive.

At the total reflection face, where $N_1$ is the index of refraction of the inner semiconductor side, $N_0$ is the index of refraction of the outer side and $\theta_1$ is the incident angle of light incident on the total reflection face, $N_1 \cdot \sin\theta_1 > N_0$ is satisfied. In addition, at the multi-layer reflection face parallel to the substrate, where $N_2$ is the index of refraction of the semiconductor and $\theta_2$ is the incident angle of light incident on the face parallel to the substrate, the relation $N_2 \cdot \sin\theta_2 < 1$ is satisfied.

The burying material is a dielectric, and a predetermined region of the total reflection face is buried with the dielectric by the following process: The process includes a step of forming a flat plane on a central portion of the total reflection semiconductor face, a step of depositing the dielectric using the flat plane as a mask and a step of removing the flat plane. Thus the predetermined portion can be buried with the dielectric by such a facilitated method.

The burying material is thermosetting resin or ultraviolet radiation setting resin, and a predetermined region of the total reflection face is buried with the thermosetting resin or the ultraviolet-radiation setting resin by the following process: The process includes a step of forming the thermosetting resin or the ultraviolet radiation setting resin on the entire total reflection semiconductor face and a step of exposing the predetermined region of the semiconductor face using an etching. Thus the predetermined portion can be buried with the thermosetting resin or the ultraviolet radiation setting resin by such a facilitated method.

The burying material may be a material having a good thermal conductivity, and the thermosetting resin or the ultraviolet radiation setting resin may contain thermally-conductive particles. Further, the multi-layer reflection face may be a dielectric multi-layer or a semiconductor multi-layer, and the semiconductor multi-layer is preferably formed on the n-side.

Further, a means having a predetermined index of refraction (for example, a lensed optical fiber, a slant-polished optical fiber or a minute prism) is brought into close contact with the reflection face such that evanescent waves, which are generated when light is totally reflected at the reflection face, can be coupled to that means as radiation mode or propagation mode. Thus laser light can be taken out of the surface emitting semiconductor laser. The laser light can be picked out without substantially deteriorating the reflectivity of the reflection face. Since the pick-out efficiency is determined from the interval of that contact, the material of the predetermined index of refraction only needs to be brought into contact with the reflection face such that the reflectivity can be preferably maintained.

The laser light can be taken out of the surface emitting semiconductor laser using light scattering at a minute uneven portion formed on the reflection face. The laser light can be picked out by such a simple structure.

Further, the active layer may be formed near the total reflection face, and the active layer is thus located along a light path of the ring cavity.

The principle of the present invention will be described referring to examples. In the present invention, a cavity is constructed by employing the total reflection effected by the difference in the index of refraction between semiconductor and air, for example. When light enters an interface between InP, with an index of refraction of 3.20, and air, with an index of refraction of 1.0, from the InP side, for example, total reflection occurs if its incident angle exceeds 18.21°. The power reflectivity in this case is 100%.

Therefore, in a semiconductor structure as shown in FIG. 1 in which ($\bar{1}$00), (111) and (1$\bar{1}\bar{1}$) faces of the InP are exposed, there exists a ring cavity wherein the incident angle on the ($\bar{1}$00) face is 19.47° and the incident angle on each of the (111) and (1$\bar{1}\bar{1}$) faces is 35.26°. In this case, since the three faces all satisfy the total reflection condition, 100% reflection is achieved and the cavity loss is zero. (Loss in the semiconductor is neglected). The surface emitting semiconductor laser with reflection faces having high reflectivity can be thus constructed without employing any multi-layer mirrors.

As described above, when a semiconductor of a zinc blende type crystal structure is used and a face-orientation dependent etching (a semiconductor face with a predetermined orientation can be readily formed by the face-orientation dependent etching) or a selective growth is employed, there can be constructed a ring cavity which has (100), ($\bar{1}$11) and ($\bar{1}$1$\bar{1}$) faces, (100), ($\bar{1}$11) and ($\bar{1}\bar{1}$1) faces, or three crystalline faces that are in an equivalent positional relationship with those three faces when considering the crystal symmetry. For example, three faces of the (100), ($\bar{1}$11) and ($\bar{1}$1$\bar{1}$) faces are equivalent with three faces of ($\bar{1}$00), (111) and (1$\bar{1}\bar{1}$) faces, three faces of (010), ($\bar{1}$11) and (1$\bar{1}$1) faces, or the like, depending on how to select the crystallographic axis. Six sets of indication of the equivalent faces exist in all. Similarly, three faces of the (100), ($\bar{1}$11) and ($\bar{1}$1$\bar{1}$) faces can be indicated by six sets in all. Those equivalent crystalline faces are generally represented by a {100} face summarily, for example, and the sign {} is used in such a sense in this specification.

Further, in a semiconductor structure as shown in FIG. 11 wherein ($\bar{1}$00), (111) and (1$\bar{1}\bar{1}$) faces of InP are exposed, there can exist a ring cavity in which the incident angle at the ($\bar{1}$00) face is 19.47° and the incident angle at the (111) and (1$\bar{1}\bar{1}$) faces is 35.26°. As described above, when light enters an interface between InP (whose index of refraction is 3.20) and air (whose index of refraction is 1.0) from the InP side, the incident angle 19.47° at the ($\bar{1}$00) face satisfies the total reflection condition since the light is totally reflected if the incident angle exceeds 18.21° in this case. On the other hand, in order that the incident angle 35.26° at the (111) and (1$\bar{1}\bar{1}$) faces satisfies the total reflection condition, the index of refraction of a burying material surrounding those faces is required to be less than 1.847. That is, the burying material with the index of refraction of below 1.847 only must be used.

The cavity loss is small also in this case since the power reflectivity of the total reflection is 100%. Here, although the incident angle is 35.26° since the example using the (111) and (1$\bar{1}\bar{1}$) faces is taken, any angled face may be used so long as a ring cavity using the total reflection can be constructed. According to the angle of the face, its burying material only needs to have an appropriate index of refraction.

The following advantages can be obtained by using such a burying material. Since the electrode never extends to the slant face of a mesa-shaped semiconductor face, a quadrangular cone-shaped semiconductor face or the like, no special precision is needed to form the electrode. Further, when a thermal radiation unit is to be formed by gluing the semiconductor face to a heat sink with a solder or the like, the fabrication thereof is easy since the burying layer is provided and the solder would not ooze out to the slant face of the semiconductor face. Further, the heat sink can be glued to almost all the face, so that the thermal radiation efficiency can be increased. Thus, no extension of the electrode and the solder to the slant semiconductor face occurs due to the burying material, the loss at the reflection face is small and the thermal radiation can be readily performed since the contact area of the laser with the heat sink can be increased.

Further, in the structure of a surface emitting semiconductor laser as shown in FIG. 16, a mesa-shaped (or the like) slant semiconductor face is formed such that the angle between the mesa-shaped slant semiconductor face and the substrate face is set at 52.5°. Here, there can exists a ring cavity wherein the incident angle at the face parallel to the substrate is 15° and the incident angle at the mesa-shaped slant semiconductor face is 37.5°.

Where light is incident on an interface between semiconductor (whose index of refraction is about 3.20) and air (whose index of refraction is about 1.0) from the substrate side, for example, the total reflection occurs when the incident angle exceeds 18.21°. The total reflection condition is thus satisfied at the mesa-shaped slant semiconductor face at which the incident angle is 37.5°. The power reflectivity of such total reflection is 100%.

On the other hand, a multi-layer reflection mirror is formed at the face parallel to the substrate to achieve a high reflection thereat. The laser light transmitted through this mirror is emitted from the substrate to the outside (the air side). At the time of the light emission from the substrate to the outside, no light would come out of the laser if the total reflection condition was satisfied at the light emission interface, and therefore, special means for achieving the light pick-out is needed. Here, in order to break the total reflection condition thereat, the incident angle at that face of the ring cavity is set below 18.21°. In this example, the incident angle is 15°. The ring cavity of this example consists of the two total reflection faces and the face with the multi-layer high-reflection mirror, so that the cavity loss is small.

These advantages and others will be more readily understood from the following detailed description of the preferred embodiments in conjunction with the drawings.

BRIEF DESCRIPTION OF THE DRAWINGS

FIG. 1 is a cross-sectional view of a first embodiment of a ring cavity type surface emitting semiconductor laser according to the present invention.

FIG. 7 is a cross-sectional view of a second embodiment of a ring cavity type surface emitting semiconductor laser according to the present invention.

FIGS. 9A to 9N are cross-sectional views for explaining a fabrication process of a third embodiment of a ring cavity type surface emitting semiconductor laser according to the present invention.

FIG. 11 is a cross-sectional view of a fourth embodiment of a ring cavity type surface emitting semiconductor laser according to the present invention.

DESCRIPTION OF THE PREFERRED EMBODIMENTS

First Embodiment

Figure 2A:
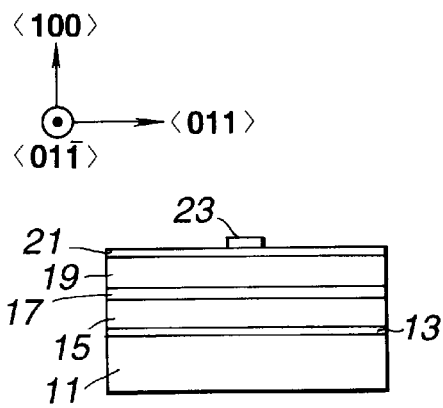
FIGS. 2A to 2J are cross-sectional views for explaining a fabrication process of the first embodiment.

A first embodiment will be described with reference to FIG. 1 and FIGS. 2A–2J. FIG. 1 shows a cross-section, taken along a plane perpendicular to a <01$\bar{1}$> direction, of a surface emitting semiconductor laser which is fabricated on a semiconductor having one face (i.e., a (100) face) of a {100} face. FIGS. 2A–2J show a fabrication process thereof. FIGS. 2A–2E show the cross-section perpendicular to the <01$\bar{1}$> direction and FIGS. 2F–2J show the cross section perpendicular to a <011> direction.

The layer structure of this embodiment will be described. On a p-InP substrate 11, a p-InGaAs etch stop layer 13 having a thickness of 0.1 $\mu$m, a p-InP clad layer 15 having a thickness of 3.4 $\mu$m, an intrinsic (i)-InGaAsP active layer 17 having a band gap wavelength of 1.3 $\mu$m and a thickness of 0.2 $\mu$m, an n-InP clad layer 19 having a thickness of 3.4 $\mu$m, and an n-InGaAs contact layer 21 having a thickness of 0.2 $\mu$m are grown in this order. As a growth method, MOCVD, MBE, CBE, or the like is used.

Figure 2F:
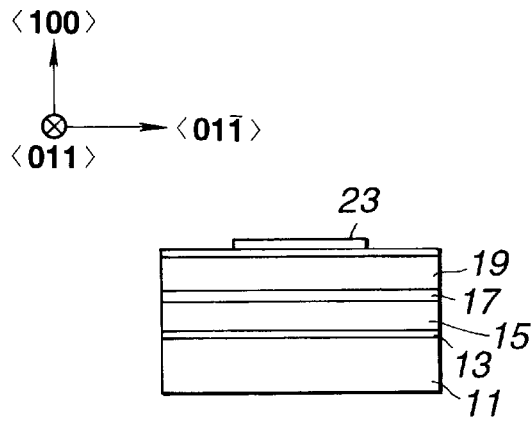

Then, an etching mask 23 of a rectangular shape, whose longer side extends in the <01$\bar{1}$> direction (a direction perpendicular to a sheet of FIG. 1), is formed on a predetermined region of the contact layer 21, as shown in FIGS. 2A and 2F. After the contact layer 21 is removed using sulfuric acid-series etchant ($H_2SO_4$:$H_2O$:$H_2O_2$=3:1:1), the clad layer 19 is etched down to the active layer 17 using hydrogen bromide/phosphoric acid etchant (HBr:$H_3PO_4$= 3:1), as shown in FIGS. 2B and 2G.

Figure 3A:
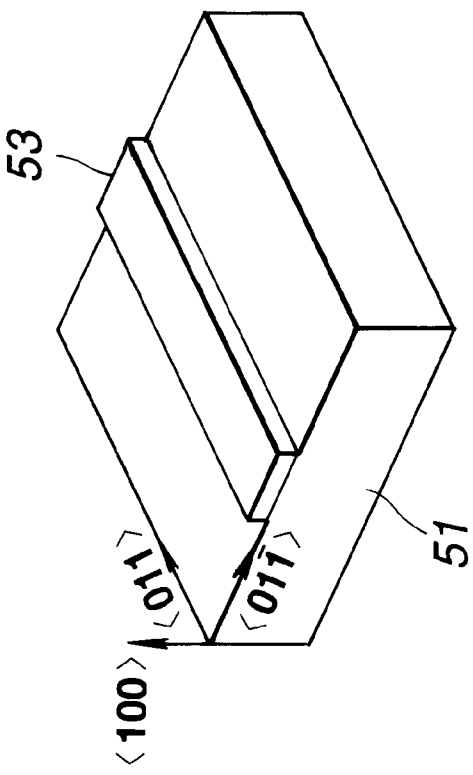
FIGS. 3A and 3B are perspective views for explaining a manner of etching.
Figure 3B:
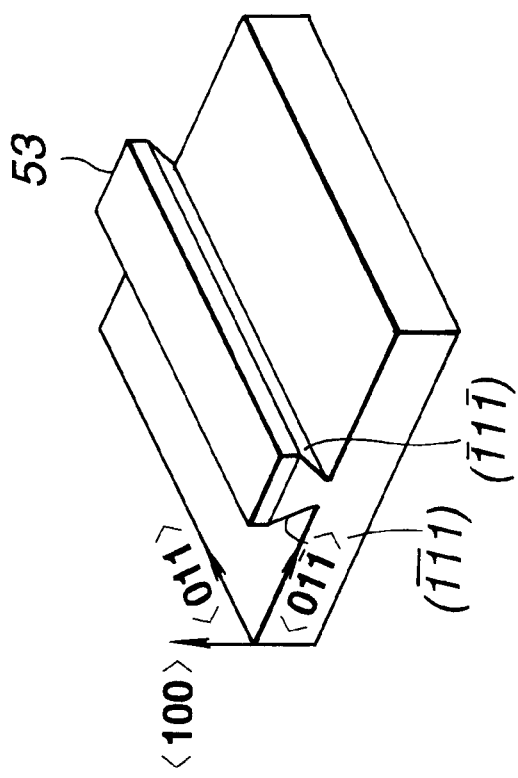
Figure 4B:
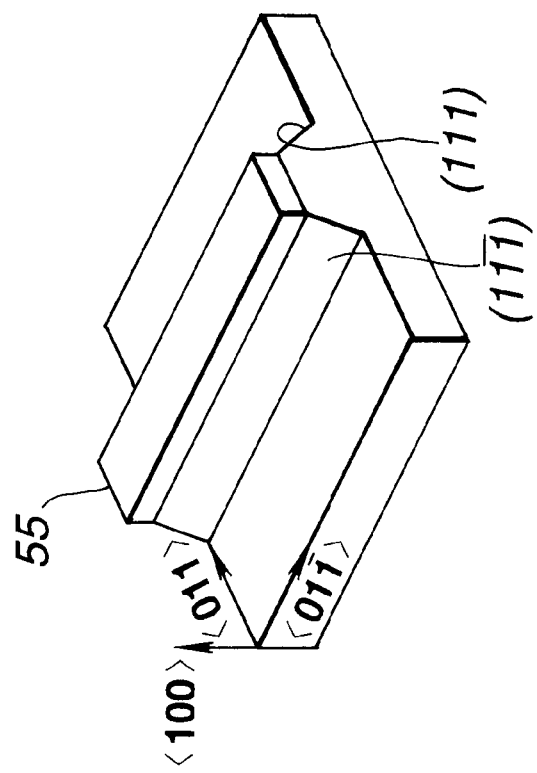
FIGS. 4A and 4B are perspective views for explaining a manner of another etching.
Figure 4A:
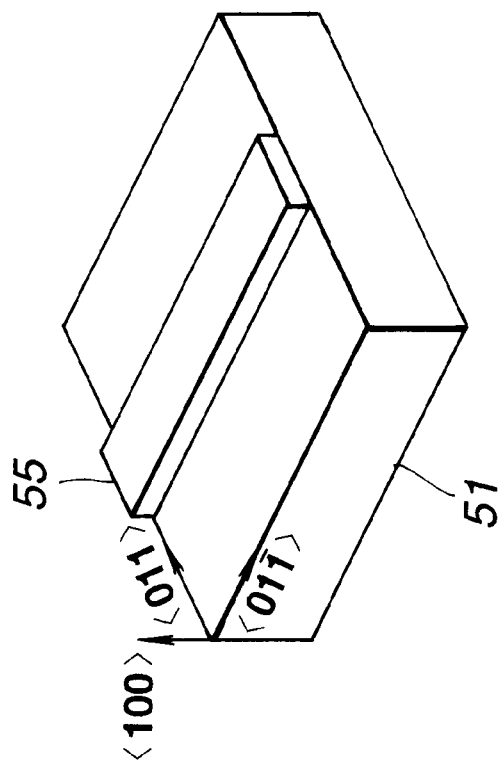

The etching manner of InP by the hydrogen bromide/ phosphoric acid etchant will be described with reference to FIGS. 3 and 4. Etching by the hydrogen bromide/phosphoric acid etchant is strongly face-orientation-dependent and has the quality that a {111}A face of InP is hardly eroded. Therefore, when InP 51 is etched using an etching mask 53 of a stripe structure (its width is about 2 $\mu$m) parallel to a <011> direction as shown in FIGS. 3A and 3B, a reverse mesa structure can be obtained with ($\bar{1}$11) and ($\bar{1}$1$\bar{1}$) faces being formed as terminal faces. In contrast, when the InP 51 is etched using an etching mask 55 of a stripe structure parallel to the <01$\bar{1}$> direction as shown in FIGS. 4A and 4B, a forward mesa structure can be obtained with (111) and (1$\bar{1}$1) faces being formed as terminal faces.

Figure 2B:
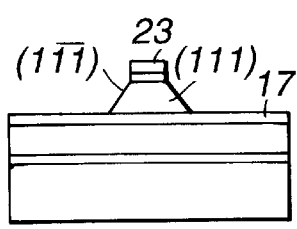
Figure 2G:
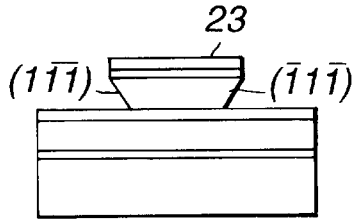

In this embodiment, since the etching mask 23 of a rectangular shape, whose longer side extends in the <01$\bar{1}$> direction, is used, the forward mesa structure can be thus obtained with (111) and (1$\bar{1}$1) faces being terminal faces, in the cross-section perpendicular to the <01$\bar{1}$> direction, and the reverse mesa structure can be thus obtained with ($\bar{1}$11) and ($\bar{1}$1$\bar{1}$) faces being terminal faces, in the cross-section perpendicular to the <011> direction, as shown in FIGS. 2B and 2G.

Figure 2C:
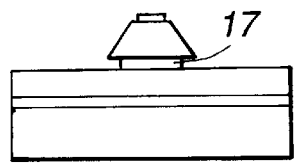
Figure 2H:
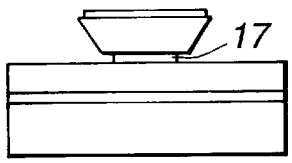

The active layer 17 is then etched using the sulfuric acid-series etchant. At this time, when the etching time is slightly prolonged, the etching along a lateral direction advances and a current constriction structure is thus formed. After that, the etching mask 23 is removed as shown in FIGS. 2C and 2H.

Figure 2D:
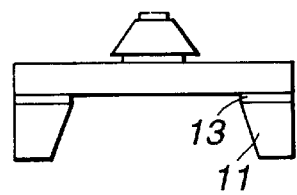
Figure 2I:
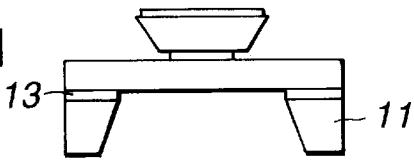
Figure 2E:
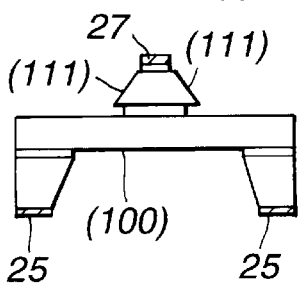
Figure 2J:
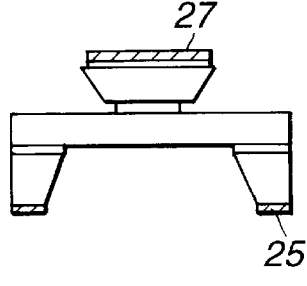

A predetermined portion of the bottom face of the substrate 11 is then etched up to the etch stop layer 13 using a hydrochloric acid-series etchant (HCl:$H_2O$=1:1). Further, the etch stop layer 13 is removed using the sulfuric acid-series etchant to expose the ($\bar{1}$00) face as shown in FIGS. 2D and 2I. Finally, a p-side electrode 25 is deposited on at least a portion of the bottom face of the etched substrate 11, and an n-side electrode 27 is deposited on the contact layer 21, as shown in FIGS. 2E and 2J.

In the semiconductor laser of this embodiment, the ($\bar{1}$00), (111) and (1$\bar{1}$1) faces are thus exposed in the cross-section perpendicular to the <01$\bar{1}$> direction, and there can be achieved a ring cavity in which the incident angle at the ($\bar{1}$00) face is 19.47° and the incident angle at the (111) and (1$\bar{1}$1) faces is 35.26°. Since the total reflection condition is satisfied at each of the three faces (those angles satisfy the total reflection conditions in respect of all polarization components of light), the 100% reflection is obtained thereat and the cavity loss is almost zero when the loss in the semiconductor is neglected. Thus the ring cavity type semiconductor laser with high-reflection faces can be fabricated without using any multi-layer mirrors.

However, since total reflection occurs at each face as it is, no light can be taken out of the laser. Therefore, an appropriate means must be provided to positively take the laser light out of the laser.

Figure 5:
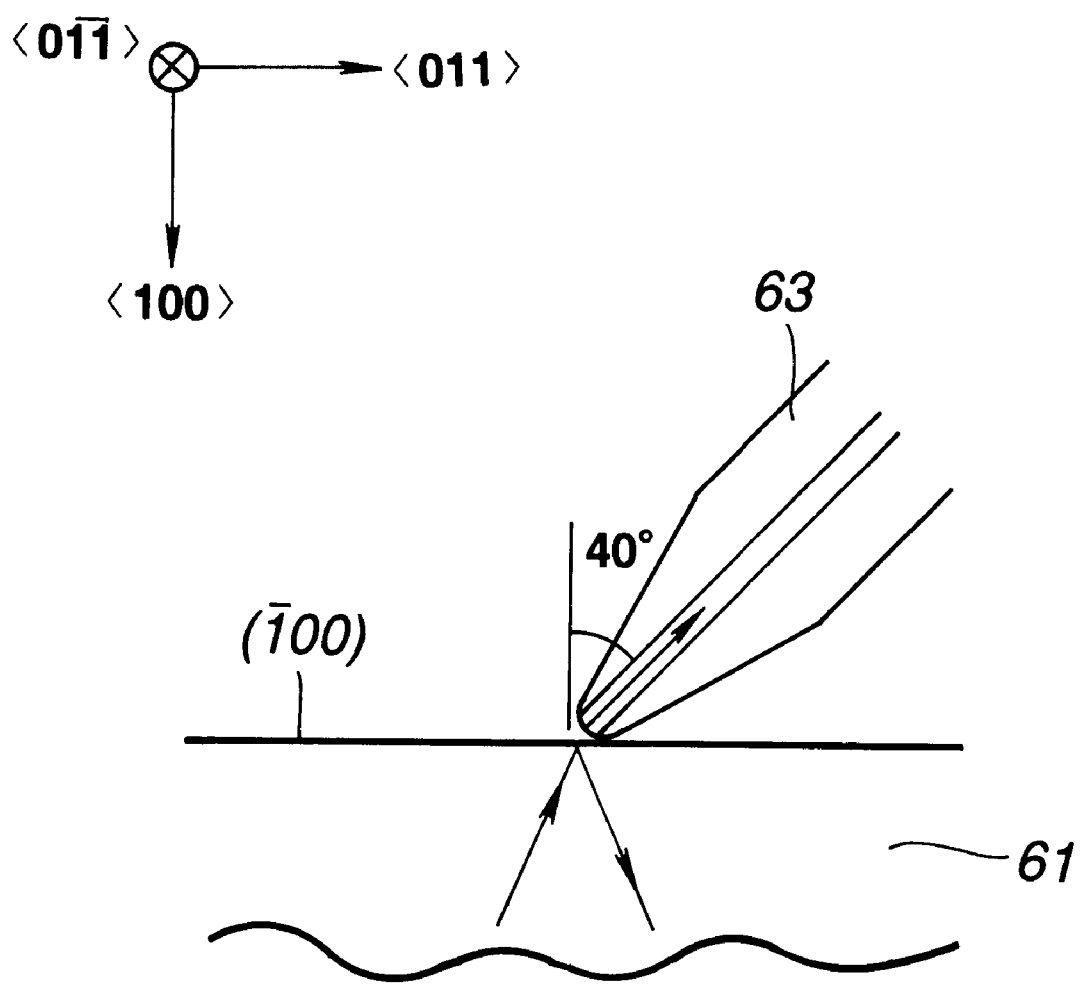
FIG. 5 is a view illustrating a laser light pick-out means according to the present invention.

In this embodiment, the laser light is designed to be picked out by bringing a lensed optical fiber 63 into a close contact with the reflection face of a semiconductor 61 as shown in FIG. 5. In this model, the angle of a tip portion of the optical fiber 63 is adjusted and the lensed optical fiber 63 is brought into a close contact with the semiconductor 61 such that evanescent waves, which are externally generated when light is totally reflected in the semiconductor, can be coupled to the optical fiber 63 as propagation mode. Thus the laser light can be taken out of the surface emitting semiconductor laser. The laser light can be picked out without substantially deteriorating the reflectivity of the reflection face. Since the pick-out efficiency is determined by the interval of that contact, the pick-out material with a predetermined index of refraction only needs to be brought into contact with the reflection face such that the reflectivity thereat can be preferably maintained. When an optical fiber with the effective index of refraction of 1.6 is used, for example, the optical fiber 63 only needs to be brought into contact (about sub-micron) with the semiconductor at about 40° from the <100> direction in the cross-section perpendicular to the <01$\bar{1}$> direction. The contact position is not limited to a center of the reflection face of the semiconductor 61. The contact location may be any place near the center, so long as the angle is the same. A jig or the like may be used to movably fix the optical fiber 63 to that contact position, for example.

The light pick-out efficiency is determined by the contact distance, and an increase in the pick-out efficiency generally results in a decrease in the reflectivity in the semiconductor 61 and hence an increase in the threshold of the semiconductor laser. In this embodiment, however, since the lensed optical fiber 63 is used, the light coupling to the optical fiber 63 occurs near the contact position only, but almost no light coupling occurs and instead, the total reflection occurs at the other region. Hence the reflectivity at that reflection face in the semiconductor is not substantially lowered from its entire standpoint. As a result, the laser oscillation remains unchanged even when the tip of the optical fiber 63 is brought into contact with the semiconductor face 61.

Figure 6:
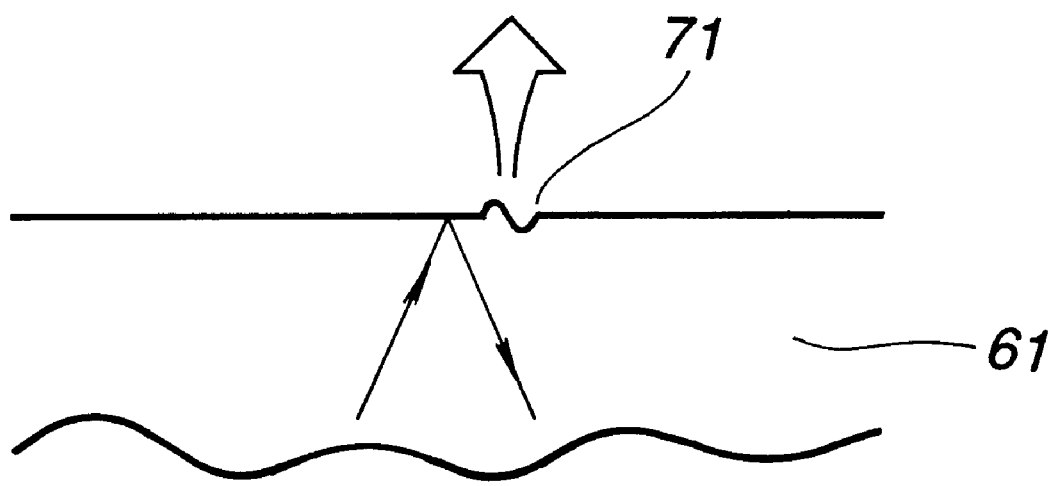
FIG. 6 is a view illustrating another laser light pick-out means according to the present invention.

As the light pick-out method, a slant-polished optical fiber or the like may be used in place of the lensed optical fiber. The evanescent wave can be likewise taken out as radiation light by placing a minute prism on the semiconductor face 61. Furthermore, a minute uneven portion 71 of a sub-micron size may be formed at an appropriate location on the reflection face of the semiconductor 61 as shown in FIG. 6 (the uneven portion can be formed by leaving a fine portion of the etch stop layer 13, by using a minute needle, or the like). In this case, the laser light can be picked out by light scattering occurring thereat.

In this embodiment, the light confinement structure and the current constriction structure in the <01$\bar{1}$> direction, other than the mesa-shaped total reflection face, are achieved by fabricating the reverse mesa structure using the face-orientation dependent etching as shown in FIGS. 2F–2J. Those structures are not, however, limited to such a type. For example, the light confinement structure can be formed by a perpendicular etching, such as RIBE, the current constriction structure can be fabricated by the diffusion of impurities, or the current constriction structure can be beforehand fabricated by burying the surroundings of the active layer 17 in the <011> direction with high-resistance InP or InP having a reverse pn junction.

When a current above a low threshold is injected through the electrodes 25 and 27 in the above-discussed ring cavity semiconductor laser, the laser light obtained under the oscillation condition in the ring cavity can be taken out by the optical fiber or the like.

Second Embodiment

A second embodiment will be described with reference to FIG. 7 and FIGS. 8A–8J. FIG. 7 shows a cross-section, taken along a plane perpendicular to a <011> direction, of a ring cavity type surface emitting semiconductor laser which is fabricated on a semiconductor having one face (e.g., a (100) face) of a {100} face. FIGS. 8A–8J show a fabrication process thereof. FIGS. 8A–8E show the cross-section perpendicular to the <01$\bar{1}$> direction and FIGS. 8F–8J show the cross-section perpendicular to the <011> direction.

The layer structure of this embodiment will be described. On a p-InP substrate 111, a p-InGaAs contact layer 113 having a thickness of 0.2 $\mu$m, a p-InP clad layer 115 having a thickness of 4.2 $\mu$m, an intrinsic (i)-InGaAsP active layer 117 having a band gap wavelength of 1.3 $\mu$m and a thickness of 0.2 $\mu$m, an n-InP clad layer 119 having a thickness of 2.6 $\mu$m, and an n-InGaAs contact layer 121 having a thickness of 0.2 $\mu$m are grown in this order. As a growth method, MOCVD, MBE, CBE, or the like is used.

Figure 8A:
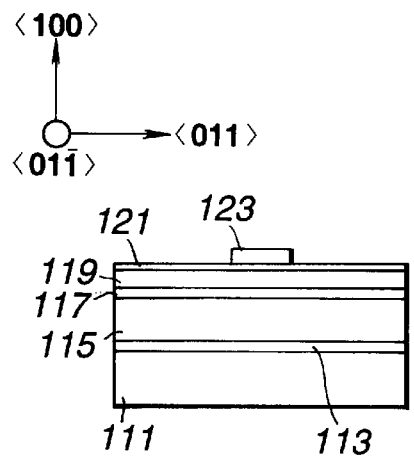
FIGS. 8A to 8J are cross-sectional views for explaining a fabrication process of the second embodiment.
Figure 8F:
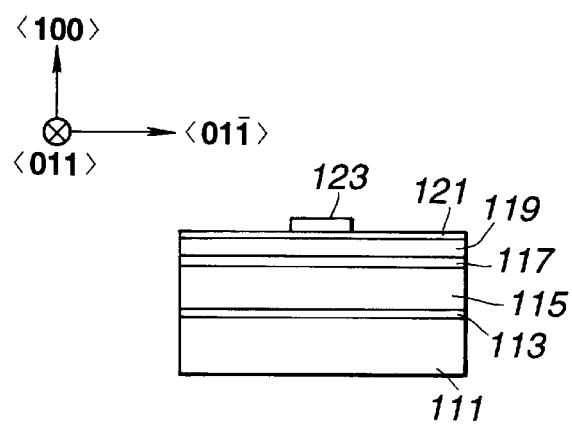
Figure 8B:
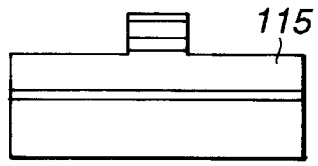
Figure 8G:
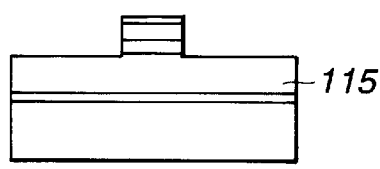

Then, an etching mask 123 of a square shape, which has a side extending in the <01$\bar{1}$> direction, is formed on a predetermined region of the contact layer 121, as shown in FIGS. 8A and 8F. After the etching is performed down to the clad layer 115 through the etching mask 123 by the RIBE method, the etching mask 123 is removed to form a rectangular rib as shown in FIGS. 8B and 8G.

Figure 8C:
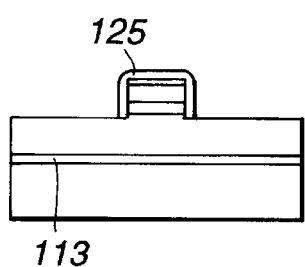
Figure 8H:
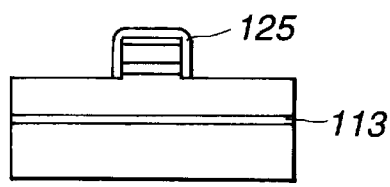
Figure 8D:
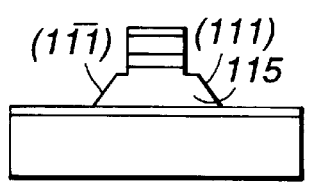
Figure 8I:
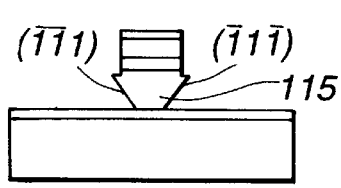

An etching mask 125 is then formed covering the rectangular rib as shown in FIGS. 8C and 8H, and the clad layer 115 is etched down to the contact layer 113 using the hydrogen bromide/phosphoric acid etchant (H$_2$SO$_4$:H$_2$O:H$_2$O$_2$=3:1:1). As a result, as described in the first embodiment, a forward mesa structure can be obtained with (111) and (1$\bar{1}\bar{1}$) faces being formed as terminal faces, in the cross-section perpendicular to the <01$\bar{1}$> direction. In contrast, a reverse mesa structure can be obtained with ($\bar{1}$11) and ($\bar{1}\bar{1}$1) faces being formed as terminal faces, in the cross-section perpendicular to the <011> direction. The etching mask 125 is then removed as shown in FIGS. 8D and 8I.

Figure 8E:
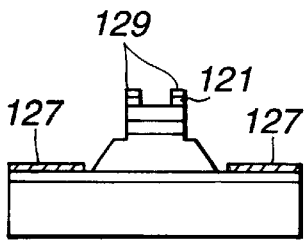
Figure 8J:
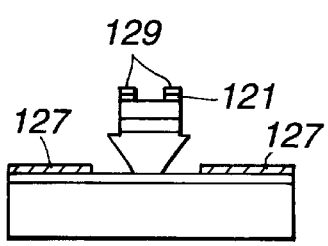

Finally, after a central portion of the contact layer 121 is removed to form a window for picking out the light, a p-side electrode 127 and an n-side electrode 129 are deposited in a square ring shape, for example, as shown in FIGS. 8E and 8J.

In the semiconductor laser of this embodiment, the (100), ($\bar{1}$1$\bar{1}$) and ($\bar{1}\bar{1}$1) faces are thus exposed in the cross-section perpendicular to the <011> direction as shown in FIG. 7, and there can be achieved a ring cavity in which the incident angle at the (100) face is 19.47° and the incident angle at the ($\bar{1}$1$\bar{1}$) and ($\bar{1}\bar{1}$1) faces is 35.26°. Since the total reflection condition is satisfied at each of the three faces similarly to the first embodiment, 100% reflection is obtained and the cavity loss is almost zero when the loss in the semiconductor is neglected. Thus the ring cavity semiconductor laser with high-reflection faces can be fabricated without using any multi-layer mirrors, similarly to the first embodiment.

With respect to the pick-out method of the laser light, the optical fiber may be brought into contact with the semiconductor, or the minute uneven portion may be formed, for example, as described in the first embodiment. In this embodiment, the laser light is designed to be taken out from above as shown in FIG. 7, so that this embodiment is somewhat superior to the first embodiment in that there is no need to perform the etching from the bottom side of the substrate 111. Further, in this embodiment, the forward mesa structure with (111) and (1$\bar{1}\bar{1}$) faces formed as the terminal faces in the cross-section perpendicular to the <01$\bar{1}$> direction is not an indispensable element thereto, and those faces may be perpendicular faces, for example, similarly to the reverse mesa structure in the first embodiment.

Third Embodiment

A third embodiment will be described with reference to FIGS. 9A–9N. FIGS. 9A–9N show a cross-section of a ring cavity type surface emitting semiconductor laser which is fabricated on a semiconductor having one face (e.g., a (100) face) of a {100} face. FIGS. 9A–9N show a fabrication process thereof. FIGS. 9A–9G show the cross-section perpendicular to the <01$\bar{1}$> direction, and FIGS. 9H–9N show the cross-section perpendicular to the <011> direction.

The layer structure of this embodiment will be described. On a p-InP substrate 211, a p-InGaAs etch stop layer 213 having a thickness of 0.2 $\mu$m, and a p-InP clad layer 215 having a thickness of 3 $\mu$m are grown in this order. A selective growth mask 217 with a stripe-shaped opening parallel to the <011> direction is then formed on the clad layer 215 as shown in FIGS. 9A and 9H.

Using the MOCVD method, a p-InP clad layer 219 having a thickness of 1 $\mu$m, an intrinsic (i)-InGaAsP active layer 221 having a band gap wavelength of 1.3 $\mu$m and a thickness of 0.2 $\mu$m, an n-InP clad layer 223 having a thickness of 2.8 $\mu$m, and an n-InGaAs contact layer 225 having a thickness of 0.2 $\mu$m are selectively grown in this order.

Figure 10B:
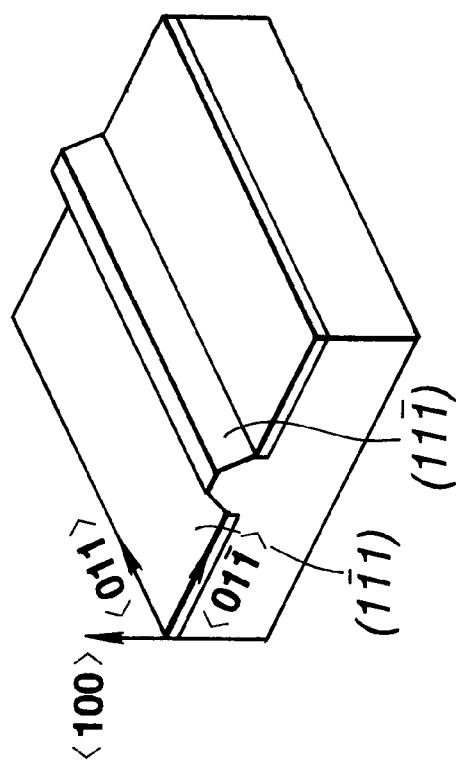
FIGS. 10A and 10B are perspective views for explaining a manner of selective growth.
Figure 10A:
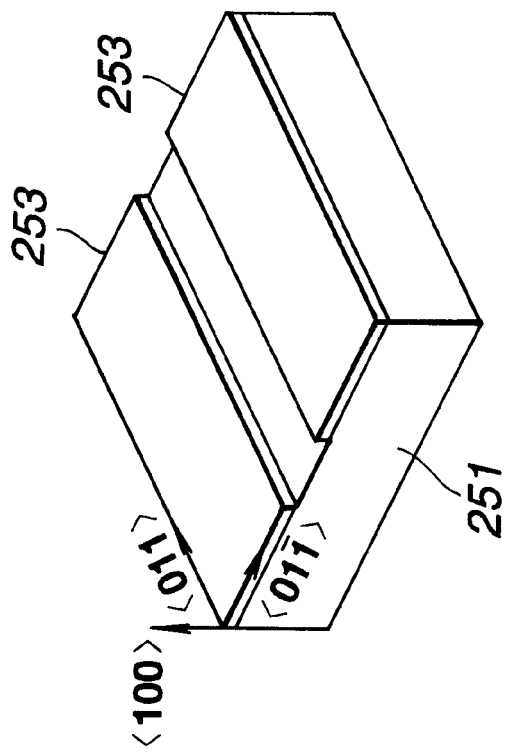

In a case where a selective growth mask 253 with a stripe-shaped opening parallel to the <011> direction is formed on InP 251 and the crystal growth is performed using the MOCVD method as shown in FIGS. 10A and 10B, it is known that the growth is hard to occur on a {111}B face and a forward mesa structure with (1$\bar{1}$1) and (11$\bar{1}$) faces formed as growth terminal faces can be hence obtained. Therefore, such a forward mesa structure can be obtained in this embodiment as shown in FIGS. 9B and 9I.

When those two faces and the ($\bar{1}$00) face obtained by the etching from the bottom side of the substrate 211 are used, there can be achieved a ring cavity which contains three total reflection faces in the cross section perpendicular to the <011> direction. (Namely, even if the process is stopped at this stage, the ring cavity semiconductor laser can be constructed.) However, when face-orientation-dependent etching as used in the first embodiment is employed, a better ring cavity type semiconductor laser can be constructed. Such a method will be further described.

Subsequent to the process of FIGS. 9B and 9I, a stripe-shaped etching mask 227 extending along the <01$\bar{1}$> direction is formed as shown in FIGS. 9C and 9J after the selective growth mask 217 is removed.

Then, after the clad layer 225 is removed using the sulfuric acid-series etchant, the clad layer 223 is etched down to the active layer 221 using the hydrogen bromide/phosphoric acid etchant. As a result, as described in the first embodiment, a forward mesa structure can be obtained with (111) and (1$\bar{1}\bar{1}$) faces being formed as terminal faces, in the cross-section perpendicular to the <01$\bar{1}$> direction, as shown in FIGS. 9D and 9K.

The active layer 221 is then etched using the sulfuric acid-series etchant. At this time, when the etching time is slightly prolonged, the etching along a lateral direction advances in the active layer 221 and the current constriction structure is thus formed. After that, the etching mask 227 is removed as shown in FIGS. 9E and 9L.

A predetermined central portion of the bottom face of the substrate 211 is then etched up to the etch stop layer 213 using the hydrochloric acid-series etchant to form a window for the light pick-out. Further, the etch stop layer 213 is removed using the sulfuric acid-series etchant to expose the ($\bar{1}$00) face as shown in FIGS. 9F and 9M. Finally, a p-side electrode 229 and an n-side electrode 231 are deposited as shown in FIGS. 9G and 9N.

With respect to the pick-out method of the laser light, the optical fiber may be brought into contact with the semiconductor, or a minute uneven portion may be formed, for example, as described in the first embodiment.

In this embodiment, since there exist a ring cavity in the cross-section perpendicular to the <001> direction and a ring cavity in the cross-section perpendicular to the <01$\bar{1}$> direction, light can be confined more effectively than in the first and second embodiments. Thus its threshold gain can be further decreased.

Fourth Embodiment

Each of the first to three embodiments is directed to a surface emitting laser with a ring cavity which uses no high-reflection multi-layer mirror and instead makes use of the fact that total reflection occurs due to a difference in the index of refraction between semiconductor and air when light is incident on its interface at an appropriate angle.

However, in the case of a surface emitting laser with a ring cavity using the total reflection mirror, the electrode must be precisely formed, because if the electrode extends to the slant portion of the semiconductor face of a mesa shape, a quadrangular cone shape or the like, loss occurs in light reflection thereat. Further, since the light pick-out is performed at the semiconductor face opposite to the semiconductor face with the mesa shape or the like, a thermal radiation means, such as a heat sink, must be glued to the semiconductor face with the mesa shape or the like with solder or the like when the thermal radiation means is to be provided. Also in this case, precise work is required since there is a need to prevent oozing of the solder to the slant portion of the semiconductor face with the mesa shape or the like. Moreover, even when the heat sink is appropriately glued, it is noted that the contact area of the heat sink is inevitably small and hence the thermal radiation can not be effectively peformed.

A fourth embodiment is directed to a surface emitting semiconductor laser which considers those disadvantages.

Figure 12A:
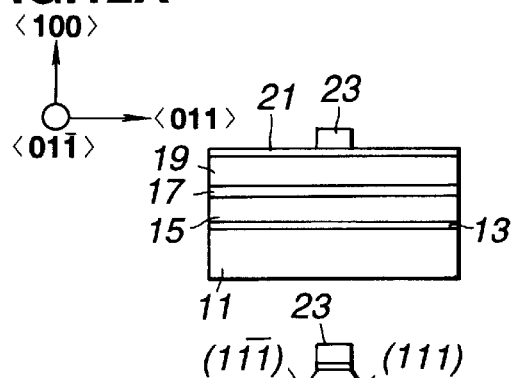
FIGS. 12A to 12N are cross-sectional views for explaining a fabrication process of the fourth embodiment.
Figure 12H:
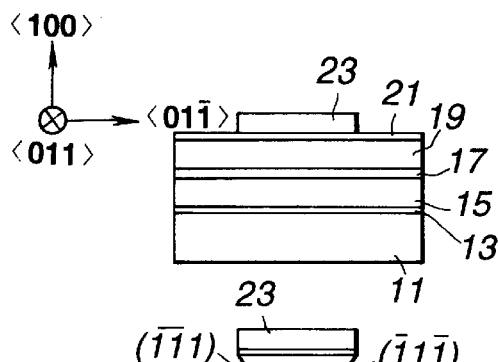
Figure 12B:
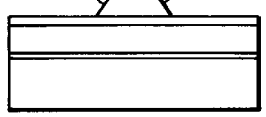
Figure 12I:
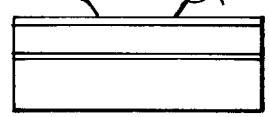
Figure 12C:
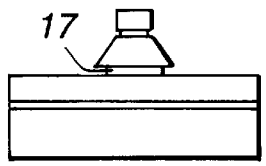
Figure 12J:
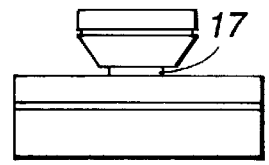

FIG. 11 shows a cross-section, taken along a plane perpendicular to the <01$\bar{1}$> direction, of a surface emitting semiconductor laser which is fabricated on a semiconductor having one face (e.g., the (100) face) of a {100} face. FIGS. 12A–12N show a fabrication process thereof. FIGS. 12A–12G show the cross-section perpendicular to the <01$\bar{1}$> direction, and FIGS. 12H–12N show the cross-section perpendicular to the <011> direction.

The layer structure of this embodiment will be described. Some of the fabrication steps of this embodiment are the same as those of the first embodiment (see FIGS. 2 et ser.), so the same portions in FIGS. 12A–12N are indicated by the same numerals and detailed explanations thereof will be omitted. In the step of FIGS. 12C and 12J of this embodiment, however, the etching mask 23 is not removed and an Al$_2$O$_3$ burying layer 324 is deposited on the etching mask 23.

Figure 12D:
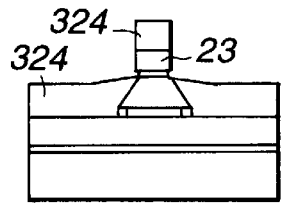
Figure 12K:
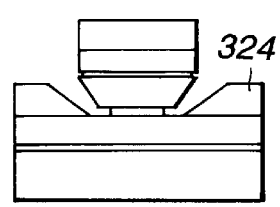
Figure 12E:
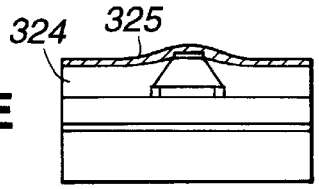
Figure 12L:
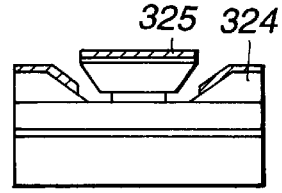

In the fourth embodiment, the Al$_2$O$_3$ burying layer 324 is layered, using the sputtering method, in a step of FIGS. 12D and 12K. At this time, particles sputtered in a slant direction are blocked by the etching mask 23, and the burying layer 324 has a tapered shape in which the thickness of the layer 324 increases toward the opposite side to the etching mask 23, as shown in FIGS. 12D and 12K. After that, a central portion of the burying layer 324 is removed together with the etching mask 23, using a lift-off method, and an n-side electrode 325 is deposited as shown in FIGS. 12E and 12L. There occurs no problem even when the electrode 325 is deposited over the entire area, because the burying layer 324 is provided.

Figure 12F:
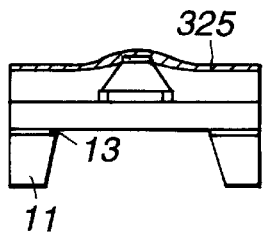
Figure 12M:
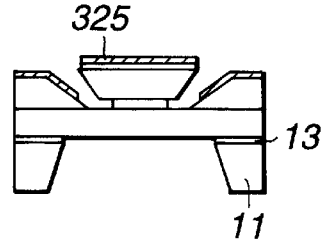
Figure 12G:
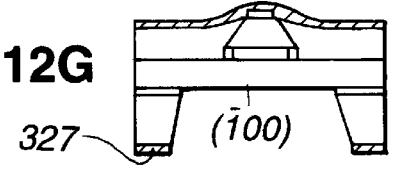
Figure 12N:
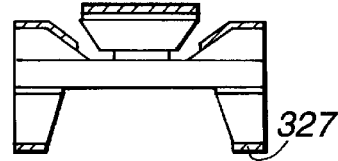

A predetermined portion of the bottom face of the substrate 11 is then etched up to the etch stop layer 13 using hydrochloric acid-series etchant (HCl:H$_2$O=1:1). Further, the etch stop layer 13 is removed using a sulfuric acid-series etchant to expose the ($\bar{1}$00) face as shown in FIGS. 12F and 12M. Finally, a p-side electrode 327 is deposited on a predetermined portion as shown in FIGS. 12G and 12N.

Also in the semiconductor laser of this embodiment, the ($\bar{1}$00), (111) and (1$\bar{1}\bar{1}$) faces are thus exposed in the cross-section perpendicular to the <01$\bar{1}$> direction, and there can be achieved a ring cavity in which the incident angle at the ($\bar{1}$00) face is 19.47° and the incident angle at the (111) and (1$\bar{1}\bar{1}$) faces is 35.26°. In this case, the interface at the ($\bar{1}$00) face is comprised of InP (the index of refraction is 3.2) and air (the index of refraction is 1.0), so that the incident angle of 19.47° satisfies the total reflection condition. Further, the interface at the (111) and (1$\bar{1}\bar{1}$) faces is comprised of InP and the Al$_2$O$_3$ burying layer 324 (the index of refraction of the Al$_2$O$_3$ burying layer 324 formed by the sputtering method is normally about 1.62), so that the incident angle of 35.26° thereat also satisfies the total reflection condition. Also in this embodiment, at each of the three faces the total reflection condition is thus satisfied, and 100% reflection is obtained. The cavity loss is hence almost zero when the loss in the semiconductor is neglected. Thus the ring cavity type semiconductor laser with high-reflection faces can be fabricated without using any multi-layer mirrors. The light pick-out method and so forth of this embodiment are the same as those of the above embodiments.

In the fourth embodiment, when the thermal radiation unit is to be formed by gluing the ring cavity type semiconductor laser to a heat sink 331 with a solder 329 as shown in FIG. 11, the fabrication thereof is easy since the burying layer 324 is provided and the solder 329 never extends to the total reflection face. Further, the heat sink 331 can be glued to almost all the face, so that the thermal radiation efficiency can be increased. Since Al$_2$O$_3$ is material with a large thermal conductivity, the thermal radiation efficiency is further improved in this respect. The burying material is not limited to Al$_2$O$_3$, and SiO$_2$, SiN$_x$, AlN, MgO or the like can also be used. The fourth embodiment is the same as the first embodiment in the other points.

Fifth Embodiment

A fifth embodiment will be described with reference to FIGS. 13A–13L. FIGS. 13A–13L show a cross-section of a ring cavity type surface emitting semiconductor laser which is fabricated on a semiconductor having one face (e.g., the (100) face) of a {100} face. FIGS. 13A–13L show a fabrication process thereof. FIGS. 13A–13F show the cross-section perpendicular to the <01$\bar{1}$> direction, and FIGS. 13G–13L show the cross section perpendicular to the <011> direction. In the fifth embodiment, thermosetting resin, such as polyimide, is used in place of Al$_2$O$_3$ as the burying layer.

The layer structure of this embodiment will be described. The same portions as those of the fourth embodiment are indicated by the same numerals.

Figure 13A:
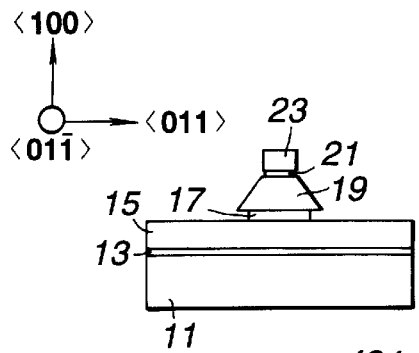
FIGS. 13A to 13L are cross-sectional views for explaining a fabrication process of a fifth embodiment of a ring cavity type surface emitting semiconductor laser according to the present invention.
Figure 13G:
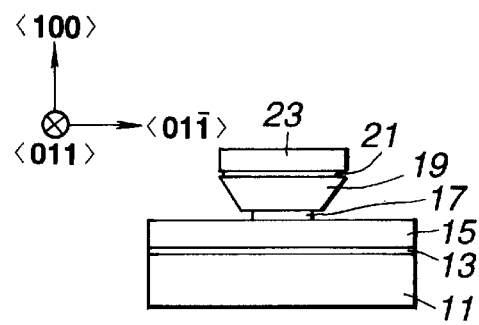
Figure 13B:
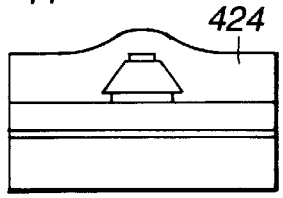
Figure 13H:
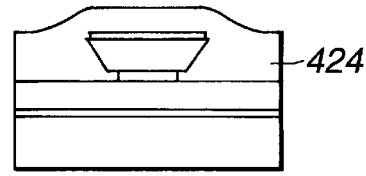
Figure 13C:
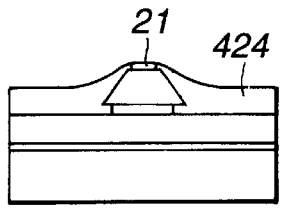
Figure 13I:
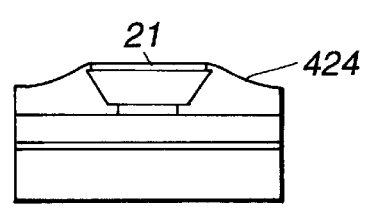

The steps shown in FIGS. 13A and 13G are the same as the step of FIGS. 12C and 12J of the fourth embodiment, and therefore, explanation thereof will be omitted. The etching mask 23 is removed, and a polyimide burying layer 424 is formed using the spin coating and sintering. Here, the thickness of the layer 424 on a projected portion on the substrate is thinner than that on its surrounding portion as shown in FIGS. 13B and 13H. Further, the burying layer 424 is etched perpendicularly by reactive ion etching (RIE) or the like, and the contact layer 21 is exposed as shown in FIGS. 13C and 13I.

Figure 13D:
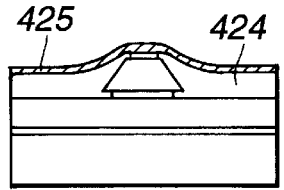
Figure 13J:
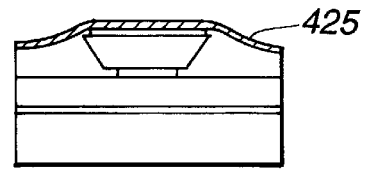
Figure 13E:
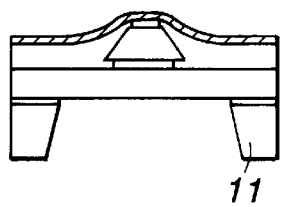
Figure 13K:
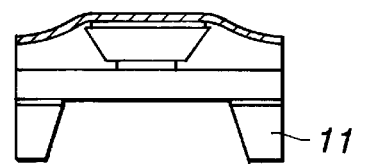
Figure 13F:
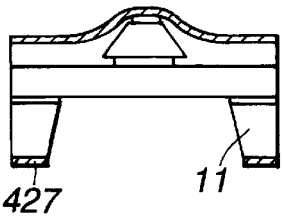
Figure 13L:
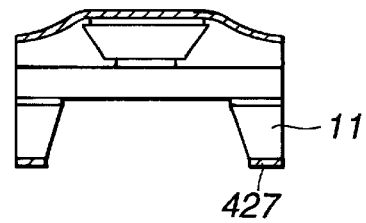

An n-side electrode 425 is then deposited as shown in FIGS. 13D and 13J. There occurs no problem even when the electrode 425 is deposited over the entire area, because the burying layer 424 is provided. Steps performed on the bottom side as shown in FIGS. 13E and 13K; and 13F and 13L are the same as those of FIGS. 12F and 12M; and 12G and 12N, and therefore, explanations thereof are omitted. As to the polyimide 424, the one that has an index of refraction satisfying the total reflection condition must be selected.

The operation of this embodiment is the same as that of the fourth embodiment. In respect of the laser light pick-out method, the optical fiber may be brought into contact with the reflection face, or a minute uneven portion may be formed on the reflection face, as described in the first embodiment. The fifth embodiment has the feature that the burying layer 424 only needs to be formed over the entire area and there is no need to perform a special patterning of the burying layer, compared to the fourth embodiment. Further, since the polyimide 424 can be put into a dent or the like, leakage current can be reduced.

In this embodiment, the polyimide is used as the burying layer, but the burying material in not limited to the polyimide. For example, thermosetting resin of a ladder silicon series or ultraviolet-radiation setting resin may be used. Thermal resistances of the thermosetting resin and the ultraviolet-radiation setting resin are generally large, but such a drawback can be compensated for or solved by mixing AlN particles or the like with large thermal conductivity into the resin. The operation of the fifth embodiment is the same as that of the fourth embodiment.

Sixth Embodiment

Figure 14A:
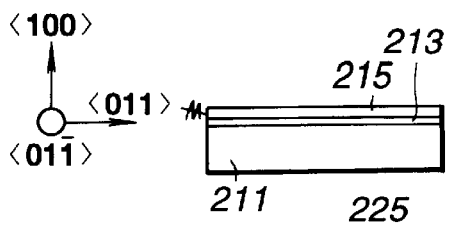
FIGS. 14A to 14P are cross-sectional views for explaining a fabrication process of a sixth embodiment of a ring cavity type surface emitting semiconductor laser according to the present invention.
Figure 14B:
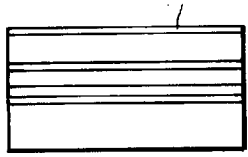
Figure 14C:
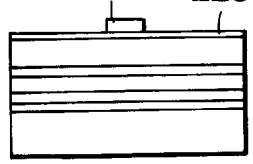
Figure 14D:
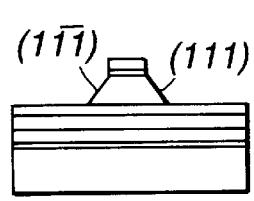
Figure 14E:
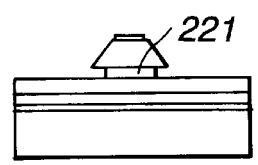
Figure 14F:
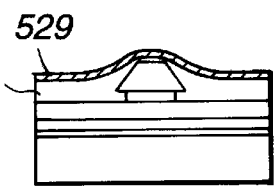
Figure 14G:
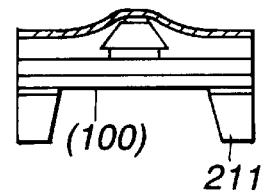
Figure 14H:
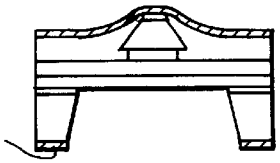
Figure 14I:
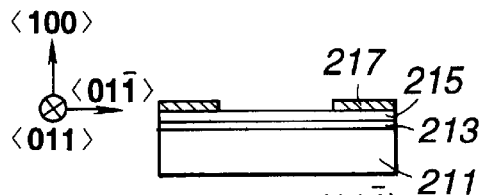
Figure 14J:
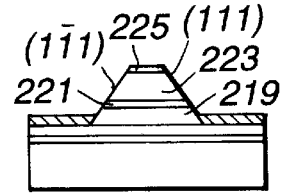
Figure 14K:
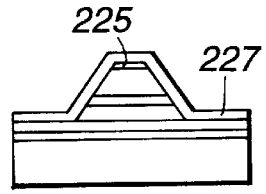
Figure 14L:
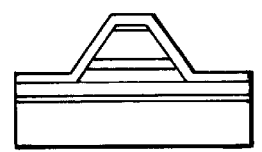
Figure 14M:
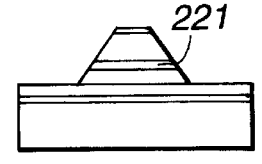
Figure 14N:
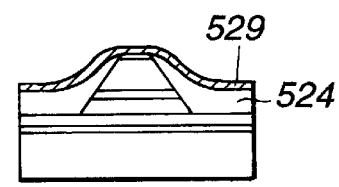
Figure 14O:
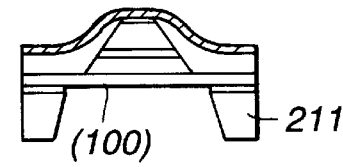
Figure 14P:
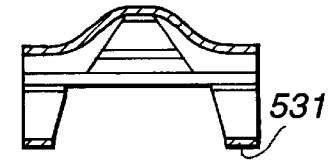

A sixth embodiment will be described with reference to FIGS. 14A–14P. FIGS. 14A–14P show a cross-section of a ring cavity type surface emitting semiconductor laser which is fabricated on a semiconductor having one face (e.g., the (100) face) of a {100} face. FIGS. 14A–14P show a fabrication process thereof. FIGS. 14A–14H show the cross-section perpendicular to the <01$\bar{1}$> direction and FIGS. 14I–14P show the cross-section perpendicular to the <011> direction.

The layer structure of this embodiment will be described. Steps up to FIGS. 14E and 14M are the same as the steps up to FIGS. 9E and 9L of the third embodiment, and therefore, explanation thereof will be omitted. The same portions as those of the third embodiment are indicated by the same numerals.

At the stage of FIGS. 14E and 14M of this embodiment, surroundings of four total reflection faces are buried with a burying layer 524 of dielectric, polyimide or the like by the same method as that used in the steps of FIGS. 13B–13D. When the ($\bar{1}$00) face obtained by the etching from the bottom side of the substrate 211 is used, a ring cavity can be constructed in each of cross-sections respectively perpendicular to the <011> direction and the <01$\bar{1}$> direction. Refernce numerals 529 and 531 are respectively an n-side electrode and a p-side electrode. This embodiment enjoys the advantages of both of the third and fourth embodiments.

Seventh Embodiment

A seventh embodiment will be described with reference to FIGS. 15A–15G. FIGS. 15A–15G show a cross-section of a ring cavity type surface emitting semiconductor laser of this embodiment. FIGS. 15A–15G show a fabrication process thereof.

The layer structure of this embodiment will be described. On a p-InP substrate 611, a p-InGaAs etch stop layer 613 having a thickness of 0.2 $\mu$m, a p-InP clad layer 615 having a thickness of 3.8 $\mu$m, an intrinsic (i)-InGaAsP active layer 617 having a band gap wavelength of 1.3 μm and a thickness of 0.2 μm, an n-InP clad layer 619 having a thickness of 3.4 μm and an n-InGaAs contact layer 621 having a thickness of 0.2 μm are grown in this order. As a growth method, MOCVD, MBE, CBE, or the like is used.

Figure 15A:
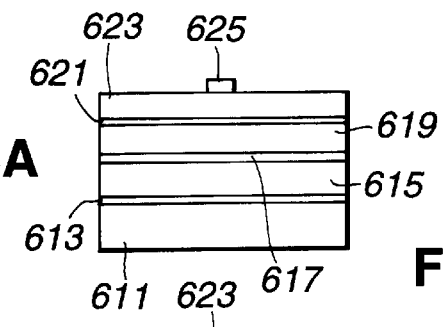
FIGS. 15A to 15G are cross-sectional views for explaining a fabrication process of a seventh embodiment of a ring cavity type surface emitting semiconductor laser according to the present invention.

Then, a photoresist 623 is layered, and an etching mask 625 of a rectangular shape, whose longer side extends in a direction perpendicular to a sheet of FIGS. 15A–15G, is formed, as shown in FIG. 15A.

Figure 15E:
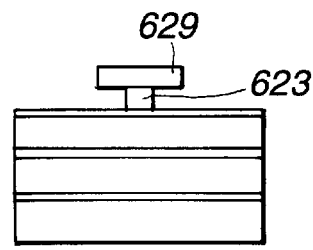
Figure 15B:
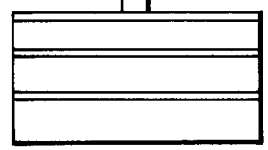
Figure 15C:
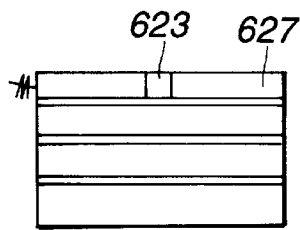

The photoresist 623 is then etched by the reactive ion etching (RIE) using oxygen, or the like, and the etching mask 625 is removed as shown FIG. 15B. Surroundings of the photoresist 623 are buried with a burying photoresist 627 having a large viscosity, as shown in FIG. 15C. After that, a mask 629 having an etching resistance is formed on the photoresist 627 as shown in FIG. 15D. The mask 629 is processed such that the width of the mask 629 is wider than that of the photoresist 623, and the burying photoresist 627 is removed as shown in FIG. 15E.

Figure 15F:
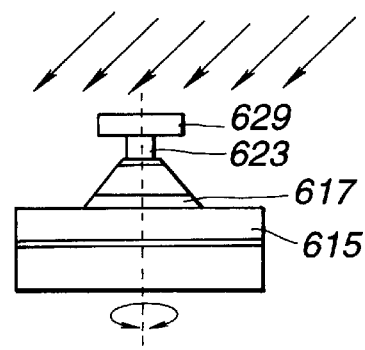
Figure 15D:
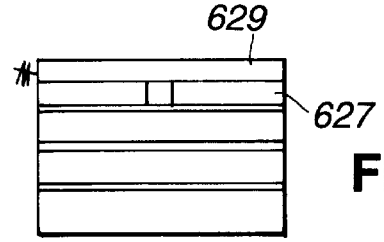

Then, etching is performed down to the p-InP clad layer 615 from a slant direction by the RIE using chlorine gas, or the like, while the substrate is rotated, as shown in FIG. 15F. When the projection angle of the ion beam is properly set, the angle of the slant semiconductor face to be formed can be freely selected.

Figure 15G:
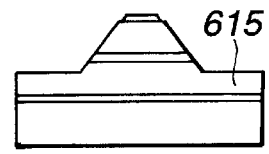

The photoresist 623 and the mask 629 are then removed to obtain a mesa shape as shown in FIG. 15G.

In steps subsequent to the step of FIG. 15G, the slant semiconductor face is covered with dielectric, thermosetting resin or the like by the method as described in the fourth and fifth embodiments, and the formation of an n-type electrode, the etching of the bottom face and the formation of a p-type electrode are performed.

In this embodiment, since the angle of the slant semiconductor face can be freely selected, compared to the above embodiments, the limitation on the index of refraction of the burying layer can be relaxed to satisfy the total reflection condition, and the device can be designed irrespective of the face orientation of the semiconductor.

Further, this embodiment can be modified to a structure which uses no burying layer as in the first, second and third embodiments. Also in this case, since the angle of the slant semiconductor face can be freely selected, the device can be designed irrespective of the face orientation of the semiconductor. Further, when the mask 629 is shaped into a circular plate, the slant semiconductor face can shaped into an approximately circular cone. Also in this case, when the angle is appropriately set, the total reflection face can be formed and a ring cavity can be obtained.

Furthermore, when the shape of the mask, the projection angle of the ion beam, the number of etching steps and the like are appropriately set, total reflection faces having a shape of a polygonal cone can be formed. Thus, when the etching method of this embodiment is employed, a variety of ring cavities with the total reflection face on the substrate side and the total reflection face formed by the etching can be formed.

The operation principle of this embodiment is essentially the same as that of the above embodiments.

In the above embodiments wherein the ring cavity is comprised of the total reflection faces only, the substrate may be an n-type in place of the p-type. Further, the etchant may be any one provided only it has the desired face-orientation dependency. The semiconductor laser is not limited to the one of an InP series, and may be a short-wavelength semiconductor laser using a GaAs substrate, for example. In this case, an appropriate process only needs to be selected according to the type. For example, the etchant is changed to an appropriate one. Furthermore, the active layer may have a multiple quantum well structure (in this case, the threshold can be further lowered) or the like.

Eighth Embodiment

Eighth to twelfth embodiments are directed to a ring cavity type surface emitting semiconductor laser with one multi-layer mirror. In those embodiments, a special means (for example, the optical fiber is brought into contact with the semiconductor face) is not required to pick the light out of the total reflection face as in the above embodiments. When a semiconductor multi-layer mirror is formed on the n-side, such a structure can solve the problem that it is hard to reduce the resistance of a semiconductor multi-layer on the p-side (it is so even if this multi-layer is doped since it includes a large number of hetero-barriers) and hence the electrode must be formed such that a current injected into the device thereby escapes the multi-layer.

Figure 16:
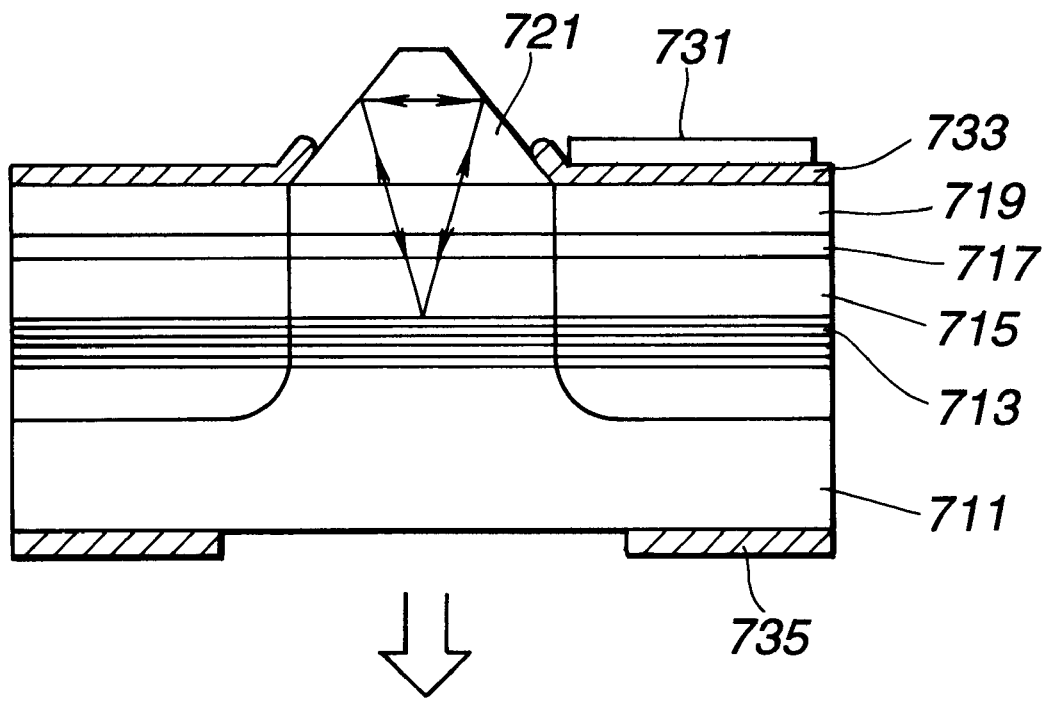
FIG. 16 is a cross-sectional view of an eighth embodiment of a ring cavity type surface emitting semiconductor laser according to the present invention.

The eighth embodiment will be described with reference to FIGS. 16 and 17A–17J. FIG. 16 shows a cross-section of this embodiment. FIGS. 17A–17J show a fabrication process thereof.

The layer structure of this embodiment will be described. On an n-GaAs substrate 711, a distributed reflector type multi-layer mirror 713 in which 20.5 pairs of n-AlAs/n-GaAs are layered, an n-$Al_{0.2}Ga_{0.8}As$ clad layer 715 having a thickness of 3.0 μm, an $In_{0.2}Ga_{0.8}As/Al_{0.2}Ga_{0.8}As$ active layer 717 having a quantum well structure, a p-$Al_{0.2}Ga_{0.8}As$ clad layer 719 having a thickness of 2.5 μm and a p-$Al_{0.3}Ga_{0.7}As$ contact layer 721 having a thickness of 4.0 μm are grown in this order (see FIG. 17A). As a growth method, MOCVD, MBE, CBE, or the like is used.

Figure 17A:
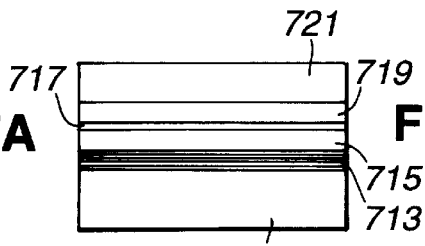
FIGS. 17A to 17J are cross-sectional views for explaining a fabrication process of the eighth embodiment.
Figure 17B:
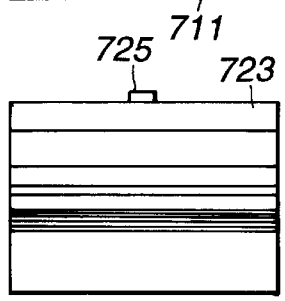

Then, a photoresist 723 is layered, and an etching mask 725 of a rectangular shape, whose longer side extends in a direction perpendicular to a sheet of FIGS. 17A–17J, is formed, as shown in FIG. 17B.

Figure 17C:
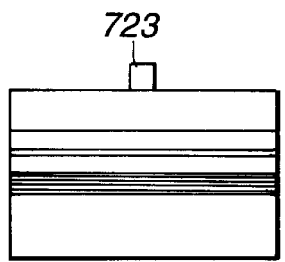
Figure 17D:
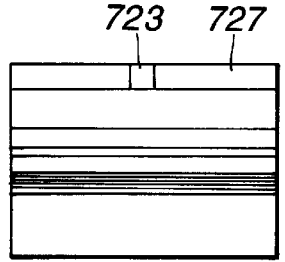
Figure 17E:
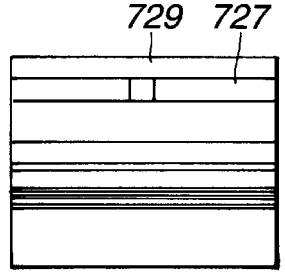
Figure 17F:
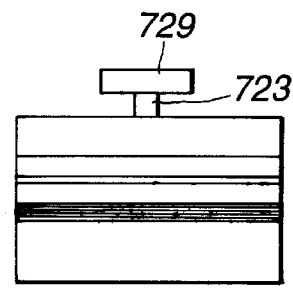

The photoresist 723 is then etched by the RIE using oxygen, or the like, and the etching mask 725 is removed as shown FIG. 17C. Surroundings of the photoresist 723 are buried with a burying photoresist 727 having a large viscosity, as shown in FIG. 17D. After that, a mask 729 having an etching resistance is formed on the photoresist 727 as shown in FIG. 17E. The mask 729 is processed such that the width of the mask 729 is wider than that of the photoresist 723, and the burying photoresist 727 is removed as shown in FIG. 17F.

Figure 17G:
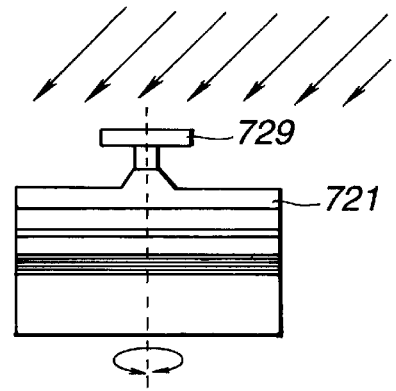
Figure 17H:
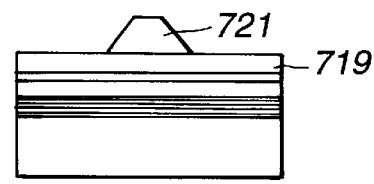

Then, etching is performed from a slant direction by the RIE using a chlorine gas, or the like, while the substrate is rotated, as shown in FIG. 17G. The photoresist 723 and the mask 729 are then removed to obtain an approximately mesa shape as shown in FIG. 17H. When the projection angle of the ion beam, the shape of the etching mask and so forth are properly set, the angle and the shape of the slant semiconductor face to be formed can be freely selected. In this embodiment, the angle between the slant face and the substrate face is set at 52.5°.

Figure 17I:
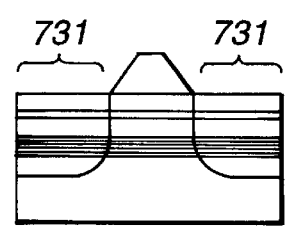
Figure 17J:
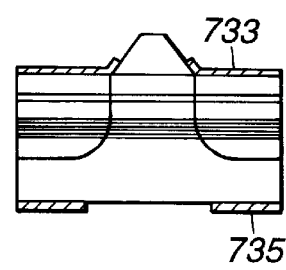

Further, a diffusion region 731 is formed by injecting impurities to restrict the region of a ring cavity, as shown in FIG. 17I. The region of the cavity has a quadrangular shape when viewd from above, and the diffusion region 731 is formed such that it encompasses the cavity region. Finally, a p-type electrode 733 and an n-type electrode 735 are deposited as shown in FIG. 17J.

In this embodiment, since the angle between the mesa-shaped slant semiconductor face and the substrate face is set at 52.5°, there can exist a ring cavity wherein the incident angle at the face parallel to the substrate is 15° and the incident angle at the mesa-shaped slant semiconductor face is 37.5°.

Where light is incident on the interface between AlGaAs (whose index of refraction is about 3.20) and air (whose index of refraction is about 1.0) from the substrate side, total reflection occurs when the incident angle exceeds 18.21°. The total reflection condition is thus satisfied at the mesa-shaped slant semiconductor face at which the incident angle is 37.5°. The power reflectivity of such total reflection is 100%.

On the other hand, the incident angle at the face parallel to the substrate is 15°, and hence part of the light is transmitted therethrough without being totally reflected at the interface between the substrate 711 and the external air. However, the multi-layer reflection mirror 713 is formed thereat to achieve a high reflection thereat. In other words, the ring cavity of this embodiment consists of the two total reflection faces and the face with the multi-layer high-reflection mirror 713, so that the cavity loss is small. A low-threshold surface emitting semiconductor laser can thus be constructed without using the muti-layer mirrors on both opposite sides. Therefore, there is no need to form the electrode 733 such that the current injected from the p-side escapes the multi-layer.

In this embodiment, the angle between the slant semiconductor face and the substrate face is set at 52.5°, but the angle is not limited to this value. The value is any one which permits formation of the ring cavity in which the total reflection condition is satisfied at the two slant faces and light is not totally reflected but instead is partially transmitted (i.e., the pick-out of the laser light to the outside is possible) at the face parallel to the substrate. Further, the method of forming the slant semiconductor face is not limited to the above-discussed one. For example, the formation of the slant semiconductor face can be achieved by a method in which two steps of ion milling or dry etching, such as RIE, are performed from a direction perpendicular to the substrate and from a slant direction inclined by a predetermined angle.

Further, the current constriction structure is formed by the impurity diffusion in this embodiment, but the method is not limited thereto. The current constriction structure can be fabricated by forming the light confinement structure using a perpendicular etching by the RIE or the like, or by burying beforehand the surroundings of the active layer with high-resistance InP or AlGaAs having the reverse pn junction. The active layer may have a bulk structure. Those changes can be applied to the other embodiments within an applicable range. The operation principle of this embodiment is essentially the same as that of the above embodiments, except the pick-out means of the laser light.

Ninth Embodiment

Figure 18:
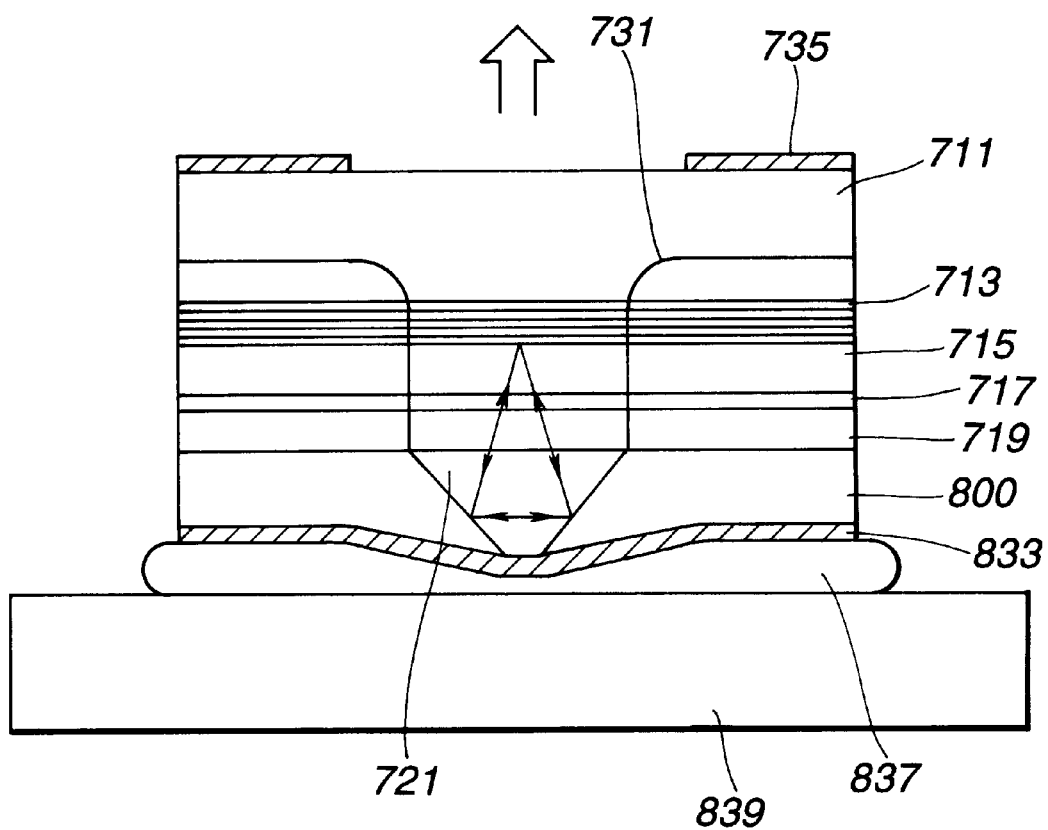
FIG. 18 is a cross-sectional view of a ninth embodiment of a ring cavity type surface emitting semiconductor laser according to the present invention.

A ninth embodiment of the present invention will be described with reference to FIG. 18. FIG. 18 shows a cross-section of a ring cavity type surface emitting semiconductor laser of this embodiment. This embodiment differs from the eighth embodiment in that the mesa-shaped slant semiconductor face is covered with dielectric material. (The relationship between the ninth embodiment and the eighth embodiment is the same as the relationship of the fourth to seventh embodiments relative to the first to third embodiments.) The semiconductor layer structure and the like of this embodiment is approximately the same as those of FIG. 16, and explanations of the same portions will be omitted. In FIG. 18, the same layers as those in FIG. 16 are indicated by the same numerals. (The up and down position in FIG. 18 is inverted compared to FIG. 16.)

In this embodiment, $Al_2O_3$ is used as a burying layer 800. The burying method will be described using FIGS. 19A–19D.

Figure 19A:
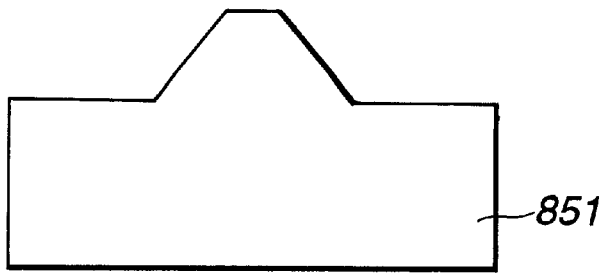
FIGS. 19A to 19D are cross-sectional views for explaining a burying manner of the ninth embodiment.
Figure 19B:
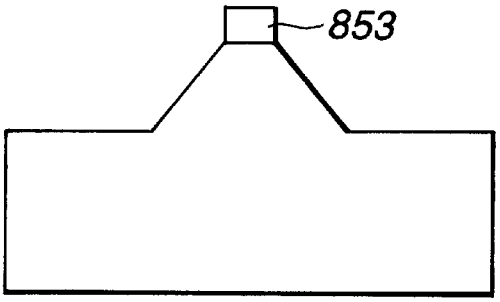
Figure 19C:
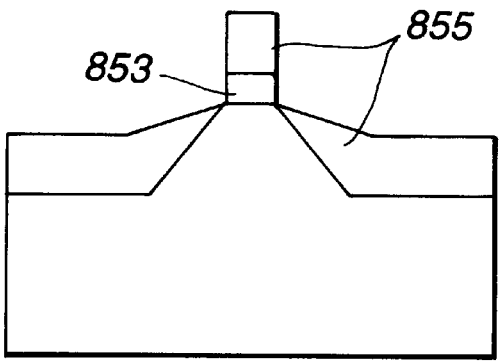
Figure 19D:
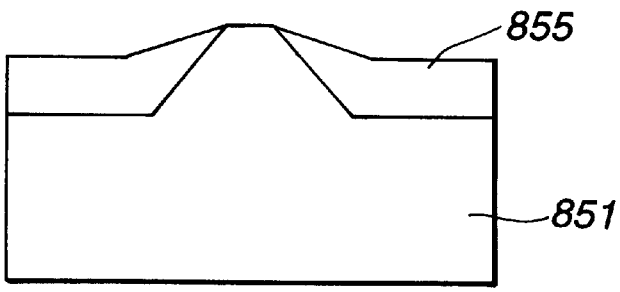

Initially, a lift-off photoresist 853 is formed on a semiconductor substrate 851 having a mesa-shaped semiconductor face (see FIG. 19A), as shown in FIG. 19B. The photoresist 853 may be newly formed, or an etching mask used at the time of the semiconductor etching may also be used as the photoresist 853. Then, an $Al_2O_3$ burying layer 855 is layered using the sputtering method. At this time, particles sputtered in a slant direction are blocked by the photoresist 853, and the burying layer 855 has a tapered shape in which the thickness of the layer 855 increases toward the opposite side to the photoresist 853, as shown in FIG. 19C. After that, a central portion of the burying layer 855 is removed together with the photoresist 853, using the lift-off method, to obtain a structure in which the semiconductor surface is exposed only at its central portion as shown in FIG. 19D.

A p-side electrode 833 is then deposited. There occurs no problem even when the electrode 833 is deposited over the entire area, because the burying layer 800 is provided. Thus, no special patterning is needed to form the electrode.

In this embodiment, the index of refraction of the $Al_2O_3$ formed by the sputtering method is normally about 1.62, so that the incident angle of 37.5° satisfies the total reflection condition. Therefore, the cavity loss is small and a low-threshold ring cavity type surface emitting semiconductor laser can be accomplished, similarly to the eighth embodiment.

In the ninth embodiment, when the thermal radiation unit is to be formed by gluing the p-side of the semiconductor laser to a heat sink 839 with a solder 837 as shown in FIG. 18, the fabrication thereof is easy since the burying layer 800 is provided and the solder 837 never extends to the total reflection face. Further, the heat sink 839 can be glued to almost all the face, so that the thermal radiation efficiency can be increased. Since $Al_2O_3$ is a material with a large thermal conductivity, the thermal radiation efficiency is further improved in this respect. As described in the fourth embodiment, the burying material is not limited to $Al_2O_3$, and $SiO_2$, $SiN_x$, AlN, MgO or the like can also be used. Naturally, the material of a larger thermal conductivity can attain a more preferable effect.

Tenth Embodiment

Figure 20A:
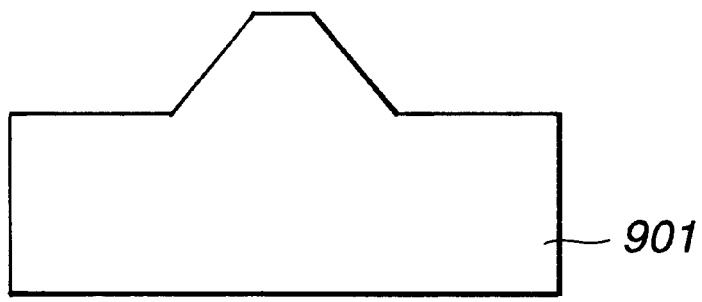
FIGS. 20A to 20C are cross-sectional views for explaining a burying manner of a tenth embodiment of a ring cavity type surface emitting semiconductor laser according to the present invention.

In a tenth embodiment, thermosetting resin, such as polyimide, is used in place of the $Al_2O_3$ burying layer in the ninth embodiment. The entire structure of this embodiment is the same as that of the ninth embodiment. The burying method in this embodiment will be described with reference to FIGS. 20A–20C.

Figure 20B:
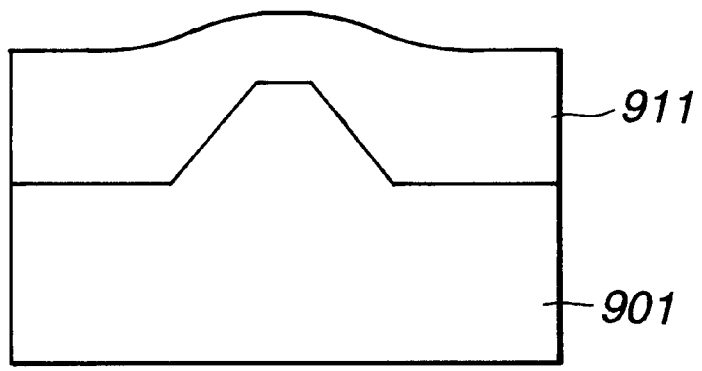
Figure 20C:
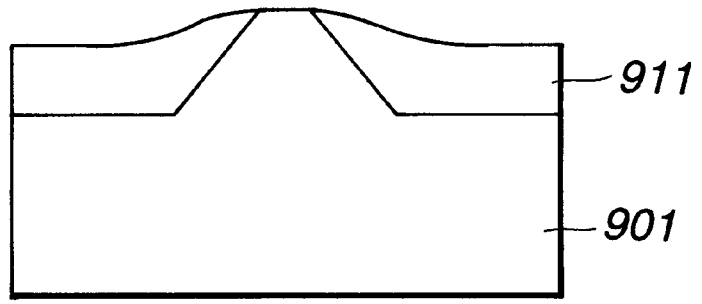

Initially, a polyimide burying layer 911 is formed on the entire surface of a semiconductor substrate 901 with a mesa-shaped semiconductor face (see FIG. 20A), using the spin coating and sintering. Here, the thickness of the layer 911 on a projected portion on the substrate 901 is thinner than that on its surrounding portion as shown in FIG. 20B. Further, the burying layer 911 is etched perpendicularly by RIE or the like, and only a central portion of the semiconductor is thus exposed as shown in FIG. 20C.

With respect to the polyimide, the one that has the index of refraction satisfying the total reflection condition only needs to be selected. The operation of this embodiment is the same as that of the eighth and ninth embodiments. In this embodiment, the burying layer only needs to be formed over the entire face and hence no special patterning for the burying layer is needed, in contrast to the ninth embodiment. The polyimide of the burying layer is the same as described in the fifth embodiment.

Eleventh Embodiment

Figure 21:
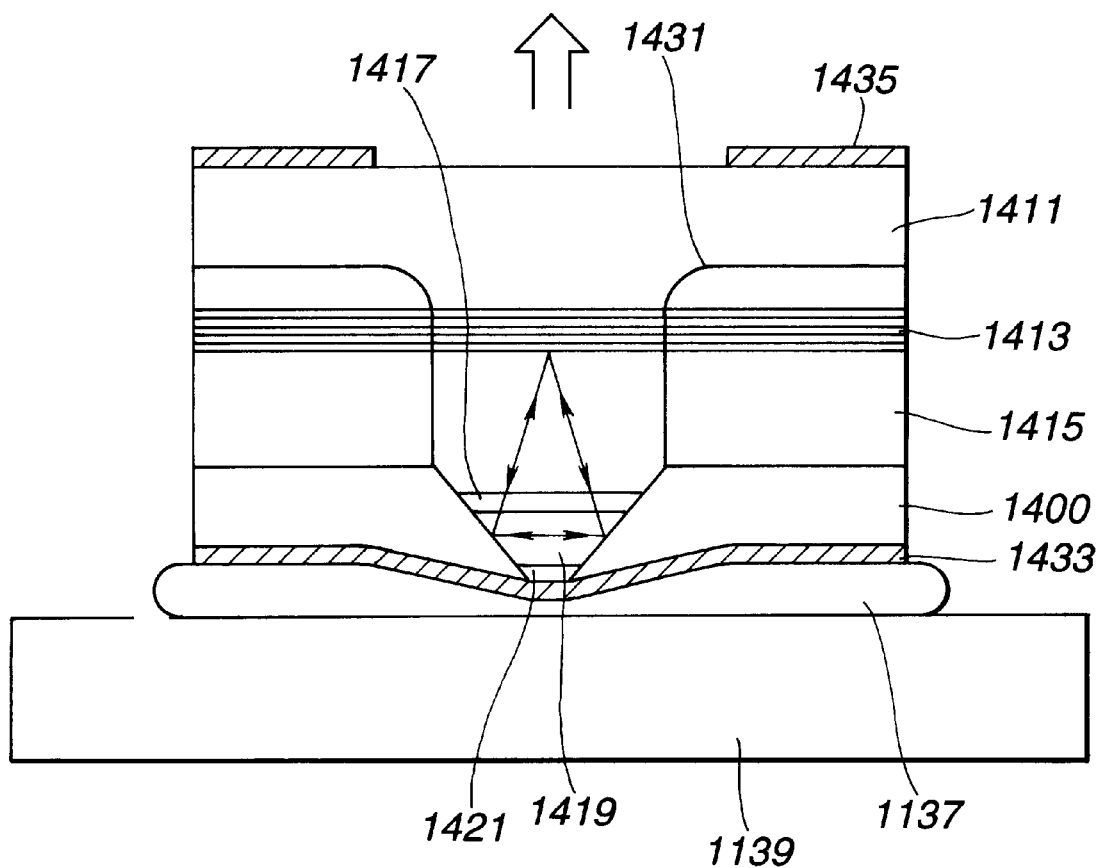
FIG. 21 is a cross-sectional view of an eleventh embodiment of a ring cavity type surface emitting semiconductor laser according to the present invention.

An eleventh embodiment will be described with reference to FIG. 21. FIGS. 21 shows a cross-section of a ring cavity type surface emitting semiconductor laser of this embodiment.

The layer structure of this embodiment will be described. On an n-GaAs substrate 1411, a distributed reflector type multi-layer mirror 1413 in which 20.5 pairs of n-AlAs/n-GaAs are layered, an n-$Al_{0.2}Ga_{0.8}As$ clad layer 1415 having a thickness of 6.0 $\mu$m, an $In_{0.2}Ga_{0.8}As/Al_{0.2}Ga_{0.8}As$ active layer 1417 having a quantum well structure, a p-$Al_{0.2}Ga_{0.8}As$ clad layer 1419 having a thickness of 2.5 $\mu$m and a p-$Al_{0.3}Ga_{0.7}As$ contact layer 1421 having a thickness of 0.5 $\mu$m are grown in this order. As a growth method, MOCVD, MBE, CBE, or the like is used.

Then, etching is conducted until the clad layer 1415 is exposed, by the method as described in the eighth embodiment, to form a mesa-shaped semiconductor. An impurity diffusion region 1431 is then formed, and an $Al_2O_3$ burying layer 1400 is formed by the method as described in the ninth embodiment. Finally, a p-side electrode 1433 and an n-side electrode 1435 are deposited. Where the thermal radiation mechanism is to be provided, the p-side of the laser is glued to a heat sink 1139 by a solder 1137.

The operation of this embodiment is the same as that of the ninth embodiment. In this embodiment, when light travels in a direction parallel to the substrate in the ring cavity, the light passes the active layer 1417 in a lateral or parallel direction, whereas the light passes the active layer in a direction perpendicular thereto in the eighth and ninth embodiments. Therefore, the active layer can be more effectively employed due to that characteristic in this embodiment. Thus the thershold can be further lowered in this embodiment. This configuration for using the active layer more effectively can also be applied to the type of the first and fourth embodiments (i.e., the type wherein all the reflection faces are the total reflection faces).

Twelfth Embodiment

Figure 22:
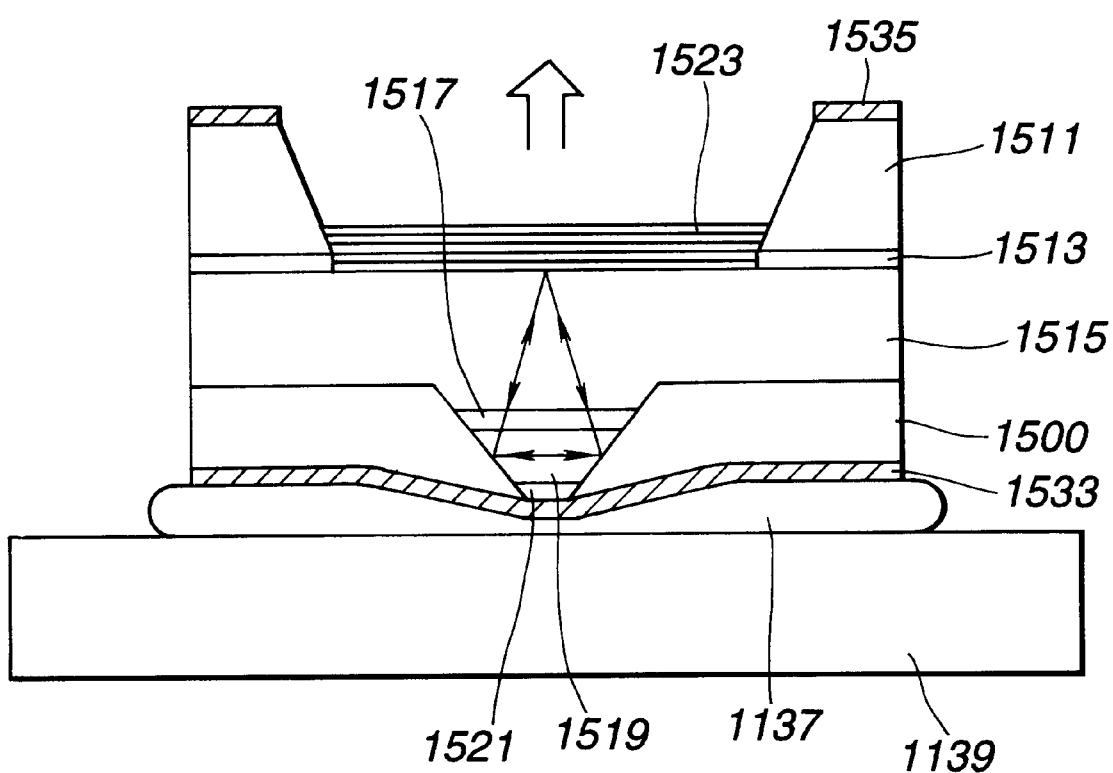
FIG. 22 is a cross-sectional view of a twelfth embodiment of a ring cavity type surface emitting semiconductor laser according to the present invention.

A twelfth embodiment will be described with reference to FIG. 22. FIGS. 22 shows a cross-section of a ring cavity type surface emitting semiconductor laser of this embodiment which uses an n-InP substrate.

The layer structure of this embodiment will be described. On an n-InP substrate 1511, an n-InGaAs etch stop layer 1513, an n-InP clad layer 1515 having a thickness of 6.0 $\mu$m, a bulk active layer 1517 of InGaAsP having a thickness of 0.2 $\mu$m and a band gap wavelength of 1.3 $\mu$m, a p-InP clad layer 1519 having a thickness of 2.5 $\mu$m and a p-InGaAs contact layer 1521 having a thickness of 0.5 $\mu$m are grown in this order. As a growth method, MOCVD, MBE, CBE, or the like is used.

Then, etching is conducted until the clad layer 1515 is exposed, by the method as described in the eighth embodiment, to form a mesa-shaped semiconductor. In respect of the light confinement in a direction not shown in FIG. 22, this structure is formed using the perpendicular etching by the RIE or the like, for example. An $Al_2O_3$ burying layer 1500 is then formed by the method as described in the ninth embodiment, and a p-side electrode 1533 is deposited.

A predetermined area of the substrate 1511 is etched to the etch stop layer 1513 from the bottom side using a hydrochloric acid-series etchant. Further, the etch stop layer 1513 is removed by the sulfuric acid-series etchant to expose the clad layer 1515. A multi-layer mirror 1523 of $Al_2O_3$/Si is then formed on a predetermined region.

Finally, an n-side electrode 1535 is deposited on a predetermined portion. Where the thermal radiation mechanism is to be provided, the p-side of the laser is glued to the heat sink 1139 by the solder 1137.

The operation of this embodiment is the same as that of the eleventh embodiment. Also in this embodiment, the cavity loss is small, and a low-threshold surface emitting semiconductor laser of a longer-wavelength series can be constructed. Further, in this embodiment, the current constriction structure can be formed by the impurity diffusion, or by burying beforehand the surroundings of the active layer with high-resistance InP or InP having the reverse pn junction, for example. The active layer may have a multiple quantum well structure. Further, $SiO_2$/Si, MgO/Si or the like may be used as the multi-layer mirror. Also in the eighth to twelfth embodiments, a p-type substrate can be used.

As described in the foregoing, a low-threshold surface emitting semiconductor laser with a small cavity loss can be achieved according to the ring cavity type surface emitting semiconductor laser of the present invention.

More specifically, a low-threshold surface emitting semiconductor laser with a small cavity loss can be obtained without using any special high-reflection multi-layer mirrors, according to the configuration of the present invention wherein the ring cavity is all comprised of the total reflection faces. The reflection face having a high reflectivity can be fabricated by a simple method according to the present invention. In this case, the light pick-out means of the surface emitting semiconductor laser can be fabricated by a simple method.

Further, a low-threshold surface emitting semiconductor laser with a small cavity loss can be obtained, according to the configuration of the present invention wherein the ring cavity is comprised of the high-reflection multi-layer mirror arranged on one side of the active region and the total reflection face. According to this configuration, a good-performance electrode can be readily formed, and no special means for picking out the laser light is needed.

Furthermore, a ring type surface emitting semiconductor laser with a small cavity loss, whose fabrication freedom is large and whose thermal radiation characteristic is improved, can be obtained, according to the configuration of the present invention wherein the ring cavity includes at least one total reflection face and the burying structure for the total reflection face is provided. The surface emitting semiconductor laser with the burying structure can be fabricated by a simple method.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A surface emitting semiconductor laser comprising:
    a substrate; and
    a ring cavity formed in a plane substantially perpendicular to said substrate, said cavity including an active region.

2. A surface emitting semiconductor laser according to claim 1, wherein said ring cavity includes a parallel face parallel to said substrate and at least one total reflection face formed opposed to said parallel face.

3. A surface emitting semiconductor laser according to claim 2, wherein said total reflection face comprises a mesa-shaped semiconductor face.

4. A surface emitting semiconductor laser according to claim 2, wherein said total reflection face comprises a polygonal cone-shaped semiconductor face.

5. A surface emitting semiconductor laser according to claim 4, wherein said total reflection face comprises a quadrangular cone-shaped semiconductor face.

6. A surface emitting semiconductor laser according to claim 2, wherein said total reflection face comprises a circular cone-shaped semiconductor face.

7. A surface emitting semiconductor laser according to claim 1, wherein said substrate comprises a semiconductor substrate of a zinc blende crystalline structure, semiconductor layers including said active layer are grown on said semiconductor substrate, and said ring cavity comprises three reflection faces of (100), ($\bar{1}11$) and ($\bar{1}1\bar{1}$) faces, or (100), ($\bar{1}11$) and ($\bar{1}1\bar{1}$) faces, or three crystalline faces which are in an equivalent positional relationship with each of said three reflection faces when considering crystalline symmetry.

8. A surface emitting semiconductor laser according to claim 7, wherein said three reflection faces comprises a (100) face, and ($\bar{1}11$) and ($\bar{1}1\bar{1}$) faces created on opposite slant faces of a reverse mesa shape which is formed by performing a face-orientation-dependent etching to a semiconductor face of said semiconductor layers with a (100) face through a stripe-shaped mask formed on said semiconductor face extending in a <011> direction, or three crystalline faces which are in an equivalent positional relationship with said three faces when considering the crystalline symmetry.

9. A surface emitting semiconductor laser according to claim 7, wherein said three reflection faces comprise a ($\bar{1}00$) face, and ($1\bar{1}\bar{1}$) and (111) faces created on opposite slant faces of a forward mesa shape which is formed by performing a face-orientation-dependent etching to a semiconductor face of said semiconductor layers with a (100) face through a stripe-shaped mask formed on said semiconductor face extending in a <$01\bar{1}$> direction, or three crystalline faces which are in an equivalent positional relationship with said three faces when considering the crystalline symmetry.

10. A surface emitting semiconductor laser according to claim 7, wherein said three reflection faces comprises a ($\bar{1}00$) face, and ($1\bar{1}1$) and ($11\bar{1}$) faces created on opposite slant faces of a forward mesa shape which is formed by performing a selective growth on a mask having a stripe-shaped opening, formed on a semiconductor face of said semiconductor layers with a (100) face and extending in a <011> direction, or three crystalline faces which are in an equivalent positional relationship with said three faces when considering the crystalline symmetry.

11. A surface emitting semiconductor laser according to claim 5, wherein said substrate comprises a semiconductor substrate of a zinc blende crystalline structure with a (100) face, semiconductor layers including said active layer are grown on said semiconductor substrate, and said quadrangular cone-shaped semiconductor face comprises ($1\bar{1}1$), (111), ($11\bar{1}$) and ($1\bar{1}1$) faces.

12. A surface emitting semiconductor laser according to claim 2, wherein said at least one total reflection face formed opposed to said parallel face comprises a face which is formed by performing an etching by projecting ion beams using an appropriately-shaped mask formed on said substrate.

13. A surface emitting semiconductor laser according to claim 12, wherein said at least one total reflection face formed opposed to said parallel face comprises a face which is formed by performing an etching by rotating said substrate about a normal thereto and projecting ion beams from a direction forming a predetermined angle relative to the normal, using an appropriately-shaped mask formed on said substrate.

14. A surface emitting semiconductor laser according to claim 2, wherein said parallel face comprises a total reflection semiconductor face.

15. A surface emitting semiconductor laser according to claim 2, wherein said parallel face comprises a multi-layer reflection face.

16. A surface emitting semiconductor laser according to claim 15, wherein said multi-layer reflection face comprises a dielectric multi-layer.

17. A surface emitting semiconductor laser according to claim 15, wherein said multi-layer reflection face comprises a semiconductor multi-layer.

18. A surface emitting semiconductor laser according to claim 17, wherein said multi-layer reflection face is formed on an n-side of said laser.

19. A surface emitting semiconductor laser according to claim 2, wherein said total reflection face is covered with a burying material.

20. A surface emitting semiconductor laser according to claim 19, wherein said total reflection face formed of semiconductor is covered, except a part thereof, with an insulating burying material whose index of refraction is smaller than the index of refraction of said semiconductor such that the total reflection condition is satisfied.

21. A surface emitting semiconductor laser according to claim 20, wherein said total reflection face is covered with said burying material, except a central portion thereof, and an electrode and said semiconductor are in an electric contact with each other at said central portion.

22. A surface emitting semiconductor laser according to claim 21, wherein said electrode is formed over all of said central portion of said total reflection face and said burying material.

23. A surface emitting semiconductor laser according to claim 19, wherein a heat sink is glued to said burying material with an adhesive.

24. A surface emitting semiconductor laser according to claim 19, wherein a relation of $N_1 \cdot \sin\theta_1 > N_0$ is satisfied at said total reflection face, where $N_1$ is the index of refraction of said semiconductor in the inside of said total reflection face, $N_0$ is the index of refraction of material in the outside of said total reflection face and $\theta_1$ is the incident angle of light at said total reflection face, and a relation of $N_2 \cdot \sin\theta_2 < 1$ is satisfied at said parallel face parallel to said substrate, which is a multi-layer reflection face, where $N_2$ is the index of refraction of semiconductor of said multi-layer reflection face and $\theta_2$ is the incident angle of light at said parallel face parallel to said substrate.

25. A surface emitting semiconductor laser according to claim 19, wherein said burying material comprises dielectric material, and a predetermined region of said total reflection face is covered with said dielectric material by performing a step of forming a plate on a central portion of a semiconductor face of said total reflection face, a step of layering said dielectric material by using said plate as a mask and a step of removing the plate.

26. A surface emitting semiconductor laser according to claim 19, wherein said burying material comprises one of thermosetting resin and ultraviolet-radiation setting resin, and a predetermined region of said total reflection face is covered with said thermosetting resin or said ultraviolet-radiation setting resin by performing a step of forming said thermosetting resin or said ultraviolet-radiation setting resin on all of a semiconductor face of said total reflection face and a step of exposing a predetermined region of said semiconductor face by etching.

27. A surface emitting semiconductor laser according to claim 26, wherein said thermosetting resin or said ultraviolet-radiation setting resin contains thermally-conductive particles.

28. A surface emitting semiconductor laser according to claim 19, wherein said burying material comprises a material having a large thermal conductivity.

29. A surface emitting semiconductor laser according to claim 2, further comprising a light pick-out means for picking laser light out of said laser, said light pick-out means being brought into contact with said total reflection face and having a predetermined index of refraction such that evanescent waves generated at the time of total reflection at said total reflection face can be coupled to said light pick-out means as radiation mode or propagation mode.

30. A surface emitting semiconductor laser according to claim 29, wherein said light pick-out means comprises one of a lensed optical fiber, a slant-polished optical fiber and a minute prism.

31. A surface emitting semiconductor laser according to claim 2, further comprising a minute uneven portion formed on said reflection face, said minute uneven portion picking laser light out of said laser by using light scattering.

32. A surface emitting semiconductor laser according to claim 2, wherein said active region is formed near said total reflection face such that said active region is located along a light path of said ring cavity.

* * * * *

UNITED STATES PATENT AND TRADEMARK OFFICE
CERTIFICATE OF CORRECTION

PATENT NO. : 6,088,378
DATED : July 11, 2000
INVENTOR(S) : YUKIO FURUKAWA

It is certified that error appears in the above-identified patent and that said Letters Patent is hereby corrected as shown below:

ON THE COVER PAGE:

Under Column [57], ABSTRACT:

Line 3, "wituout" should read "without"--.

COLUMN 8

Line 49, "the(" should read --the--; and
   Line 50, "I00)" should read --(I00)--.

COLUMN 9

Line 20, "so" should read --as--.

COLUMN 15

Line 46, "can" should read --can be--; and
   Line 63, "it," should read --if it--.

COLUMN 16

Line 58, "viewd" should read --viewed--.

COLUMN 19

Line 53, "In" should read --With--; and
   Line 54, "of" should read --to--.

UNITED STATES PATENT AND TRADEMARK OFFICE
CERTIFICATE OF CORRECTION

PATENT NO.    : 6,088,378
DATED         : July 11, 2000
INVENTOR(S)   : YUKIO FURUKAWA It is certified that error appears in the above-identified patent and that said Letters Patent is hereby corrected as shown below:

<u>COLUMN 21</u>

Line 17, "comprises" should read --comprise--;
    Line 18, "and ($\overline{1}$1)" should read --($\overline{1}$1)--;
    Line 29, "and (1$\overline{1}$)" should read --(1$\overline{1}$)--;
    Line 38, "comprises a (" should read --comprise a--; and
    Line 39, "$\overline{1}$00) face, and (1$\overline{1}$1)" should read
        --($\overline{1}$00)face, (1$\overline{1}$1)--.

Signed and Sealed this

Twenty-second Day of May, 2001

Attest:

NICHOLAS P. GODICI

Attesting Officer

Acting Director of the United States Patent and Trademark Office